(12) United States Patent
Park et al.

(10) Patent No.: US 10,847,536 B2
(45) Date of Patent: Nov. 24, 2020

(54) MANUFACTURING METHOD OF A SEMICONDUCTOR DEVICE

(71) Applicant: SK hynix Inc., Icheon-si (KR)

(72) Inventors: In Su Park, Icheon-si (KR); Ki Jun Yun, Yongin-si (KR); Ki Hong Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/254,148

(22) Filed: Jan. 22, 2019

(65) Prior Publication Data

US 2019/0378856 A1    Dec. 12, 2019

(30) Foreign Application Priority Data

Jun. 7, 2018  (KR) .......................... 10-2018-0065609

(51) Int. Cl.
*H01L 27/11582*  (2017.01)
*H01L 27/11565*  (2017.01)
*H01L 21/768*  (2006.01)
*H01L 27/1157*  (2017.01)
*H01L 21/28*  (2006.01)

(52) U.S. Cl.
CPC .. *H01L 27/11582* (2013.01); *H01L 21/76832* (2013.01); *H01L 27/1157* (2013.01); *H01L 27/11565* (2013.01); *H01L 29/40117* (2019.08)

(58) Field of Classification Search
CPC ................... H01L 27/11575; H01L 27/11582
See application file for complete search history.

(56) References Cited

U.S. PATENT DOCUMENTS

| 9,824,966 | B1 | 11/2017 | Kanakamedala et al. |
| 2018/0053686 | A1* | 2/2018 | Hyun ................ H01L 27/11575 |
| 2019/0027450 | A1* | 1/2019 | Choi ........................ H01L 24/13 |
| 2019/0035798 | A1* | 1/2019 | Hwang ............... H01L 29/0649 |
| 2019/0371807 | A1* | 12/2019 | Nishikawa ........ H01L 27/11529 |
| 2019/0378854 | A1* | 12/2019 | Lee ................... H01L 27/11582 |

FOREIGN PATENT DOCUMENTS

| KR | 1020150044878 A | 4/2015 |
| KR | 1020150073251 A | 7/2015 |
| KR | 1020170073978 A | 6/2017 |

* cited by examiner

*Primary Examiner* — Farun Lu
(74) *Attorney, Agent, or Firm* — William Park & Associates Ltd.

(57) ABSTRACT

A method of manufacturing a semiconductor device includes forming a first etch stop pattern on a lower structure including a first region and a second region to expose the second region, stacking a plurality of stack structures on the lower structure to overlap the second region and the first etch stop pattern, forming a stepped stack structure by etching the plurality of stack structures to expose an end portion of the first etch stop pattern, forming a slit passing through the stepped stack structure and the first etch stop pattern, and replacing sacrificial layers of the plurality of stack structures and the first etch stop pattern with conductive patterns through the slit.

19 Claims, 25 Drawing Sheets

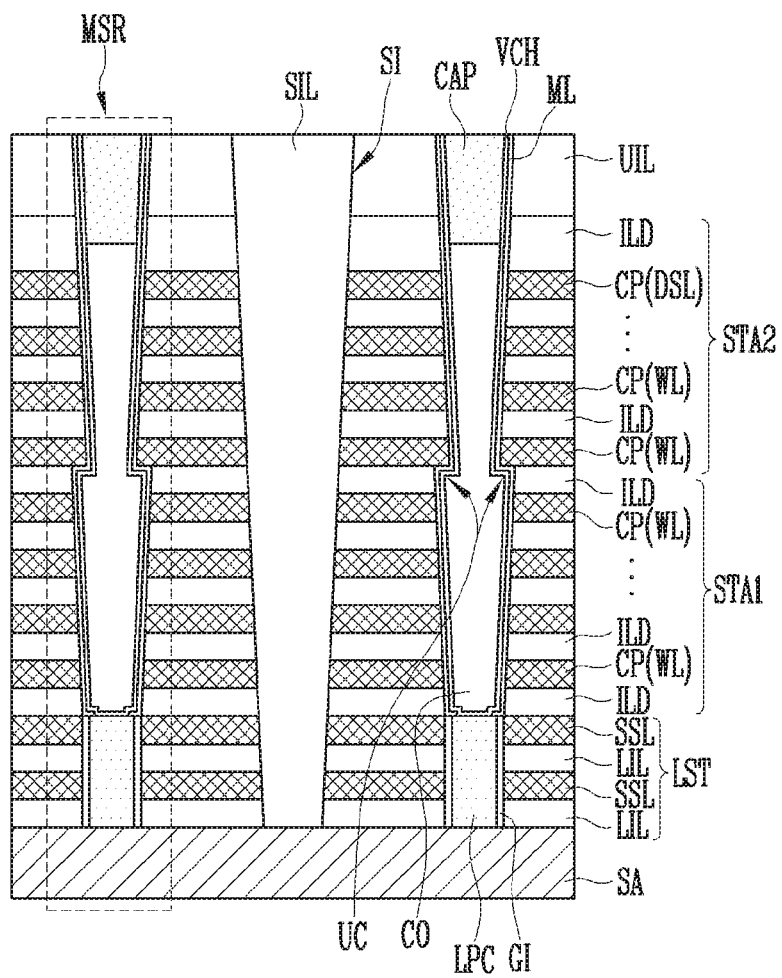

MANUFACTURING METHOD OF A SEMICONDUCTOR DEVICE

CROSS-REFERENCE TO RELATED APPLICATION

The present application claims priority under 35 U.S.C. § 119(a) to Korean patent application number 10-2018-0065609 filed on Jun. 7, 2018 in the Korean Intellectual Property Office, the entire disclosure of which is incorporated herein by reference.

BACKGROUND

1. Technical Field

The present disclosure generally relates to a semiconductor device and a method of manufacturing a semiconductor device, and more particularly, to a three-dimensional semiconductor device and a method of manufacturing a three-dimensional semiconductor device.

2. Related Art

A semiconductor device may include a memory device capable of storing data. A three-dimensional semiconductor device has been proposed so as to improve integration density of the semiconductor device. The three-dimensional semiconductor device may include memory cells stacked on a substrate to be spaced apart from each other. The three-dimensional semiconductor device may include interlayer insulating layers, conductive patterns, a vertical channel passing through the interlayer insulating layers and the conductive patterns, and a data storage layer arranged between each of the conductive patterns and the vertical channel. The memory cells may be defined at intersections of the vertical channel and the conductive patterns.

To increase storage capacity of the three-dimensional semiconductor device, a large number of conductive patterns and interlayer insulating layers may be stacked. Thereby, however, a level of difficulty of a manufacturing process may increase.

SUMMARY

In accordance with an embodiment, a method of manufacturing a semiconductor device may include forming a lower structure including a first region and a second region, forming a first etch stop pattern on the lower structure to expose the second region, stacking a plurality of stack structures on the lower structure to overlap the second region and the first etch stop pattern, forming a stepped stack structure by etching the plurality of stack structures to expose an end portion of the first etch stop pattern, forming a slit passing through the stepped stack structure and the first etch stop pattern, and replacing sacrificial layers of the plurality of stack structures and the first etch stop pattern with conductive patterns through the slit.

In accordance with an embodiment, a method of manufacturing a semiconductor device may include forming a lower structure including a first region and a second region; forming a first etch stop pattern on the lower structure to expose the second region; forming a first stack structure on the lower structure to overlap the second region and the first etch stop pattern; forming a second etch stop pattern on the first stack structure to expose the second region; forming a second stack structure on the second etch stop pattern, the second stack structure overlapping the first region and extending over the second region to overlap the second region; forming a stepped stack structure by etching the second stack structure, the second etch stop pattern, and the first stack structure to expose an end portion of the first etch stop pattern; forming a slit passing through the stepped stack structure and the first etch stop pattern; and replacing sacrificial layers of each of the first and second stack structures, the first etch stop pattern, and the second etch stop pattern with conductive patterns through the slit.

BRIEF DESCRIPTION OF THE DRAWINGS

FIGS. 3A to 3D are cross-sectional views illustrating various structures of a memory string according to embodiments of the present disclosure;

DETAILED DESCRIPTION

The technical spirit of the present disclosure may be changed in various manners and may be implemented as embodiments having various aspects. Hereinafter, the present disclosure will be described by a limited number of possible embodiments so that those skilled in the art can implement the present disclosure in practice.

Although the terms "first" and/or "second" are used herein to describe various elements, the elements should not be limited by these terms. The terms are only used to distinguish one element from another element, not to indicate a number or priority of elements. For instance, a first element discussed below could be termed a second element, and a second element could be termed a first element without departing from the teachings of the present disclosure.

When one element is referred to as being "coupled" or "connected" to another element, the one element can be directly coupled or connected to the other element or intervening elements may be present between the "coupled" or "connected" elements. In contrast, when an element is referred to as being "directly coupled" or "directly connected" to another element, there are no intervening elements present between the "directly coupled" or "directly connected" elements. Other expressions that explain a relationship between elements, such as "between," "directly between," "adjacent to," or "directly adjacent to" should be construed in the same way.

When one element is referred to as being "on" another element, the one element can be directly on the other element or intervening elements may be present between the one element and the other element. In contrast, when an element is referred to as being "directly on" another element, there are no intervening elements present between the element and the other element.

The terminology used herein is for the purpose of describing particular embodiments only and is not intended to be limiting. In the present disclosure, singular forms are intended to include the plural forms as well, unless the context clearly indicates otherwise. It will be further understood that the terms "comprise," "include," "have," etc., when used in this specification, specify the presence of stated features, numbers, steps, operations, elements, components, and/or combinations thereof but do not preclude the presence or addition of one or more other features, numbers, steps, operations, elements, components, and/or combinations thereof.

Embodiments of the present application are directed to a manufacturing method of a semiconductor device that may be capable of lowering a level of difficulty of a manufacturing process of a three-dimensional semiconductor device.

Figure 1:
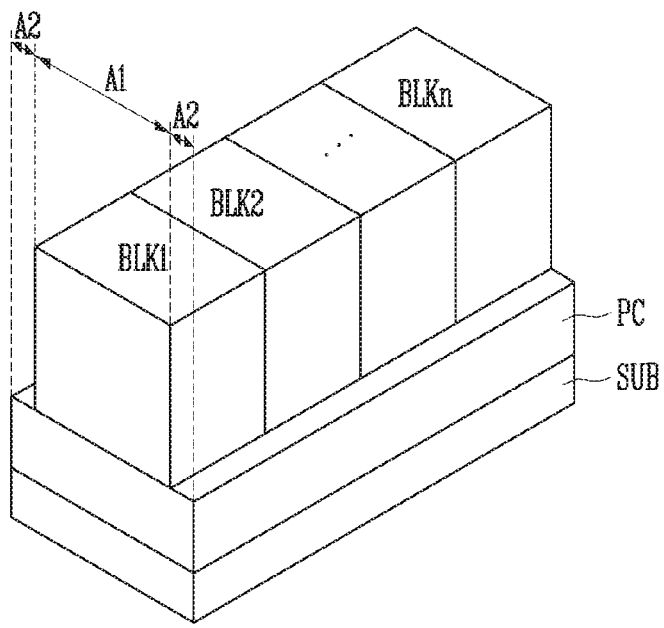
FIG. 1 is a block diagram schematically illustrating a semiconductor device according to an embodiment of the present disclosure.

FIG. 1 is a block diagram schematically illustrating a semiconductor device according to an embodiment of the present disclosure.

Referring to FIG. 1, the semiconductor device according to an embodiment may include a substrate SUB, a peripheral circuit structure PC disposed on the substrate SUB, and memory blocks BLK1 to BLKn disposed on the peripheral circuit structure PC.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method. The substrate SUB may include a first region A1 and a second region A2. The first region A1 of the substrate SUB may be overlapped with the memory blocks BLK1 to BLKn. The second region A2 of the substrate SUB may not be overlapped with each of the memory blocks BLK1 to BLKn.

The peripheral circuit structure PC may include a row decoder, a column decoder, a page buffer, and a control circuit. The peripheral circuit structure PC may include n-channel metal oxide semiconductor (NMOS) transistors and p-channel metal oxide semiconductor (PMOS) transistors electrically coupled to the memory blocks BLK1 to BLKn, a resistor, and a capacitor. The peripheral circuit structure PC may be overlapped with at least one of the first region A1 and the second region A2 of the substrate SUB.

The memory blocks BLK1 to BLKn each may include a plurality of cell strings electrically coupled to bit lines, impurity doping regions, word lines, and select lines. The memory blocks BLK1 to BLKn may be overlapped with the first region A1.

Figure 2A:
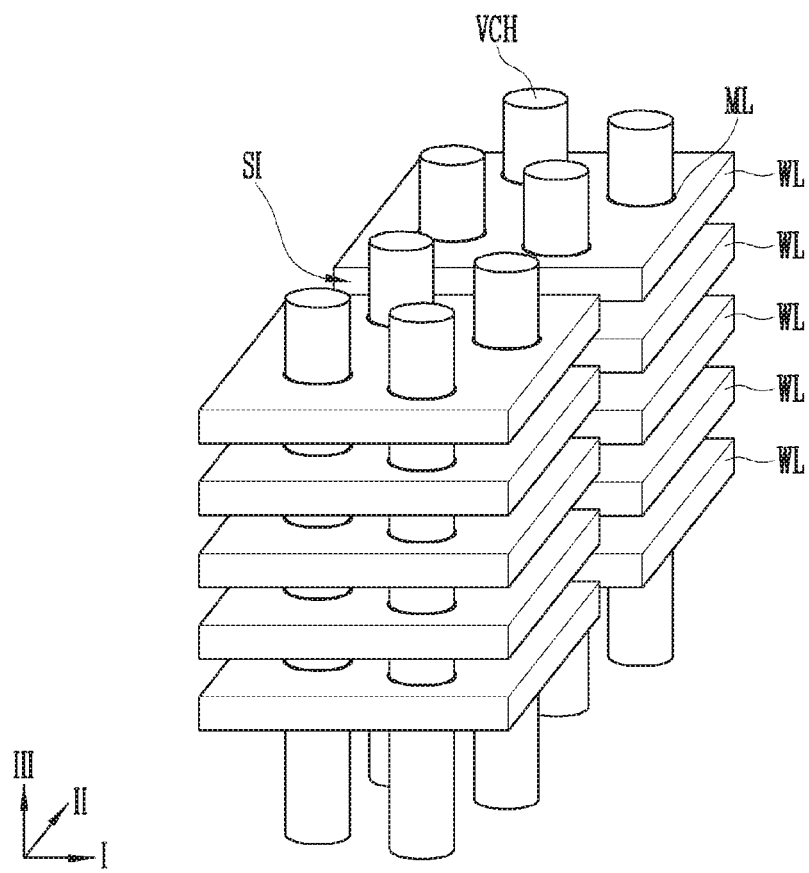
FIGS. 2A to 2C are diagrams illustrating a structure of a memory block according to an embodiment of the present disclosure.
Figure 2B:
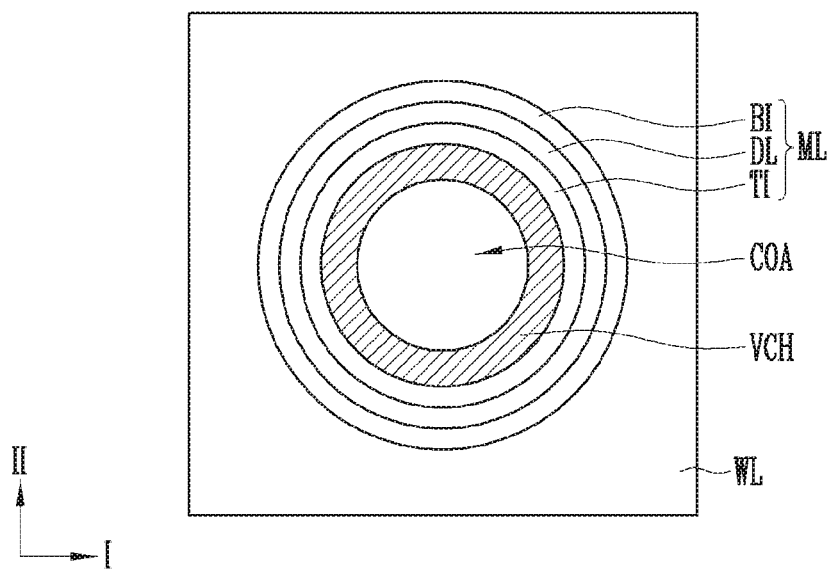
Figure 2C:
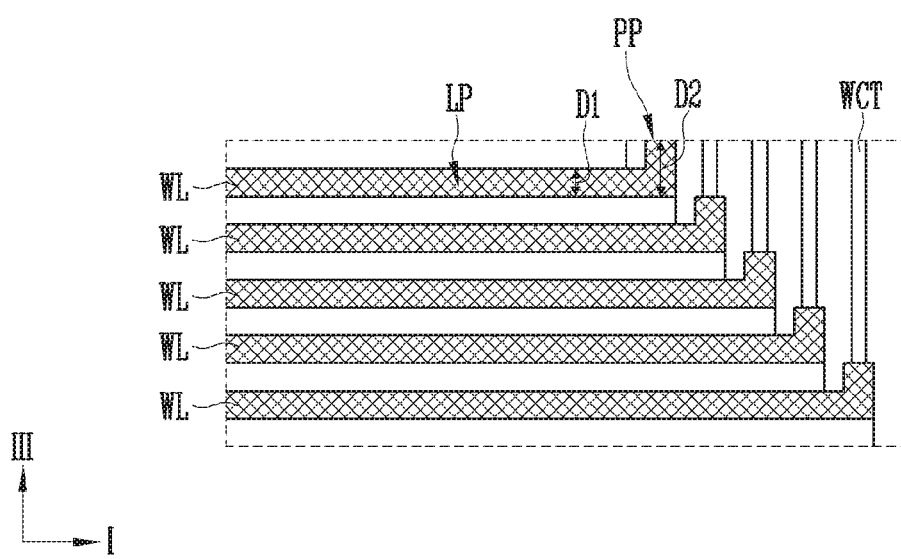

FIGS. 2A to 2C are diagrams illustrating a structure of a memory block according to an embodiment of the present disclosure.

FIG. 2A is a perspective view illustrating a three-dimensional arrangement of memory cells included in the memory block.

Referring to FIG. 2A, the memory block according to an embodiment may include word lines WL parallel to a horizontal plane extending along a first direction I and a second direction II. The first direction I may intersect the second direction II. The word lines WL may be conductive patterns coupled to gate electrodes of the memory cells. Each of the word lines WL may have a linear shape extending along the first direction I. The word lines WL neighboring each other in the second direction II on the same plane may be separated from each other by a slit SI. The word lines WL may be stacked to be spaced apart from each other in a third direction III. The third direction III may perpendicularly cross the horizontal plane extending along the first direction I and the second direction II. Each of the word lines WL may enclose vertical channels VCH.

Each of the vertical channels VCH may extend in the third direction III to pass through the word lines WL. In order to increase arrangement density of the vertical channels VCH, the vertical channels VCH may be arranged in a zigzag format. However, an embodiment of the present disclosure may not be limited thereto. For example, the vertical channels VCH may be arranged in a matrix format.

Each of multilayers ML including a data storage layer may be disposed between each of the vertical channels VCH and each of the word lines WL. The memory cells may be formed at intersections of the word lines WL and each of the vertical channels VCH. Gate electrodes of a plurality of memory cells disposed on the same horizontal plane may be commonly controlled by one of the word lines WL. Each of the vertical channels VCH may serve as a channel of a plurality of memory cells stacked in the third direction III.

FIG. 2B is an enlarged cross-sectional view of the multilayer ML disposed between each vertical channel VCH and each word line WL as illustrated in FIG. 2A.

Referring to FIG. 2B, the vertical channel VCH may be surrounded by the multilayer ML. The multilayer ML may be disposed between the vertical channel VCH and the word line WL. The multilayer ML may include a tunnel insulating layer TI enclosing the vertical channel VCH, a data storage layer DL enclosing the tunnel insulating layer TI, and a blocking insulating layer BI enclosing the data storage layer DL. The data storage layer DL may store data changed using Fowler-Nordheim tunneling caused by a difference in voltage between the word line WL and the vertical channel VCH. For this operation, the data storage layer DL may include various materials, for example, a nitride layer capable of trapping charges. In addition, the data storage layer DL may include silicon, a phase-change material, nanodots, etc. The blocking insulating layer BI may include an oxide layer capable of blocking charges. The tunnel insulating layer TI may include a silicon oxide layer capable of charge tunneling.

The vertical channel VCH may include a semiconductor layer. For example, the vertical channel VCH may include a silicon layer. The vertical channel VCH may have various structures. For example, the vertical channel VCH may have a ring shape defining a core region COA. The core region COA may be completely filled with the vertical channel VCH. In another example, the core region COA may be filled with at least one of an insulating layer and a doped semiconductor layer.

FIG. 2C is a cross-sectional view illustrating end portions of the word lines WL illustrated in FIG. 2A.

Referring to FIG. 2C, the word lines WL may be stacked in the third direction III to form a step structure. In other words, the word lines WL may include a lower pattern and an upper pattern which form the step structure. The upper pattern may be defined as being disposed above the lower pattern. An end portion of the lower pattern may be longer than the upper pattern in the first direction I so as to be exposed without being overlapped by the upper pattern.

Each of the word lines WL may be divided into a line portion LP and a pad portion PP. The pad portion PP may extend from an end portion of the line portion LP. The pad portion PP may have a greater thickness than the line portion LP in the third direction III. In other words, a thickness D2 of the pad portion PP may be greater than a thickness D1 of the line portion LP. The pad portion PP may be exposed by the step structure of the word lines WL. An end portion of each of the word lines WL may protrude in the third direction III by the pad portion PP. Each of word line contact plugs WCT may be coupled to the corresponding pad portion PP to extend in the third direction III. The thick pad portion PP may prevent a phenomenon in which the word line contact plugs WCT pass through the word lines WL.

A memory string included in the memory block may include the structures described in FIGS. 2A to 2C. A memory string according to an embodiment of the present disclosure may be variously embodied.

FIGS. 3A to 3D are cross-sectional views illustrating various structures of a memory string according to an embodiment of the present disclosure.

Figure 3A:
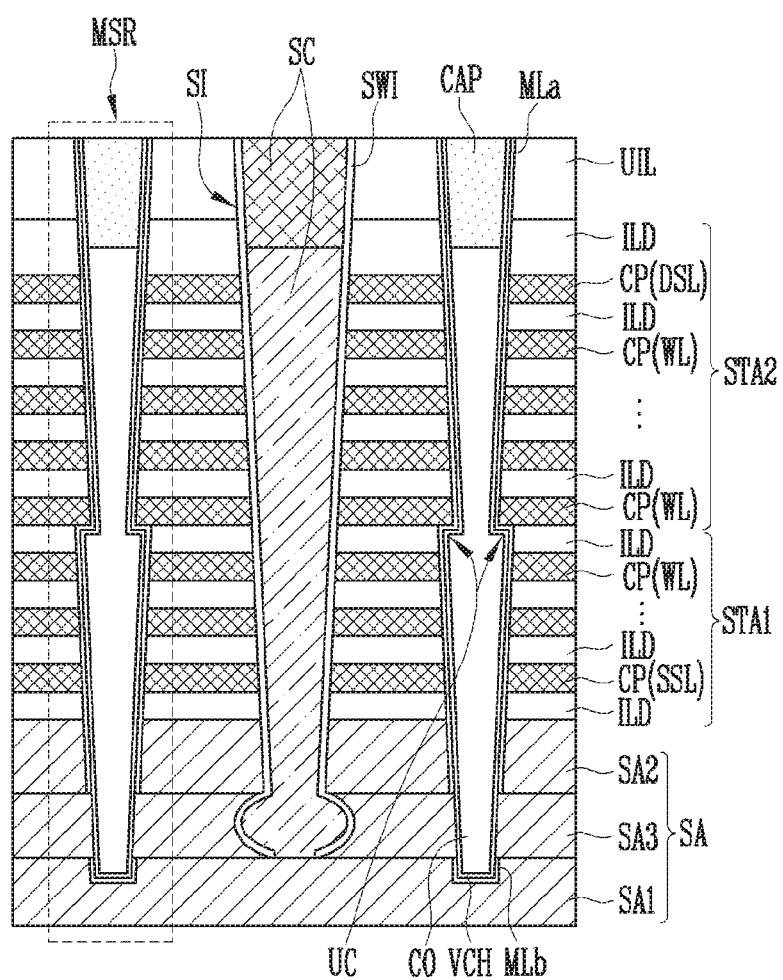
Figure 3B:
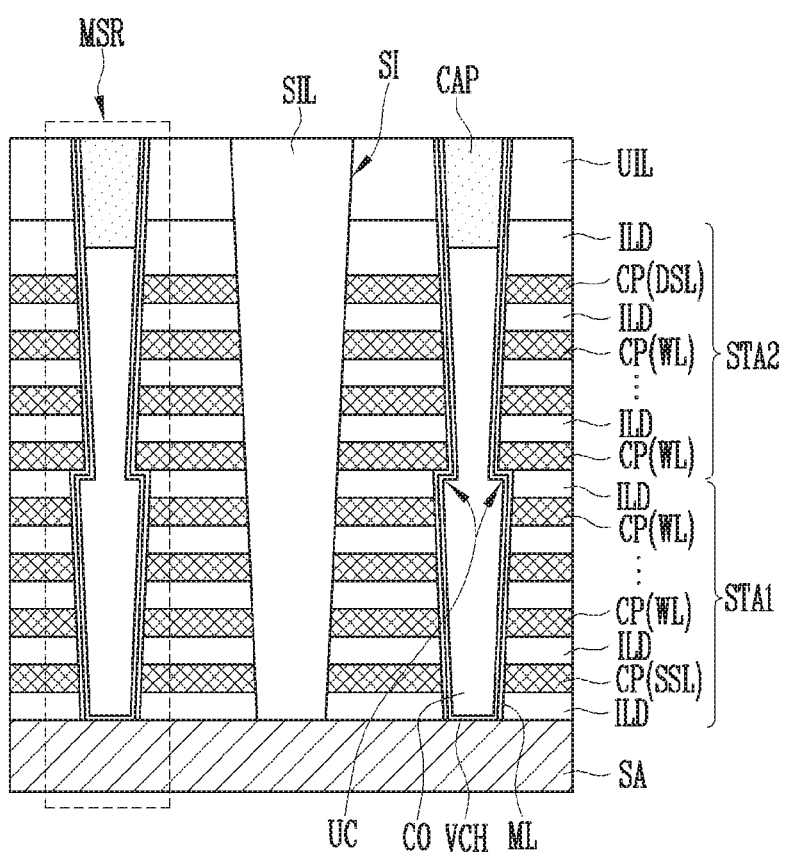
Figure 3D:
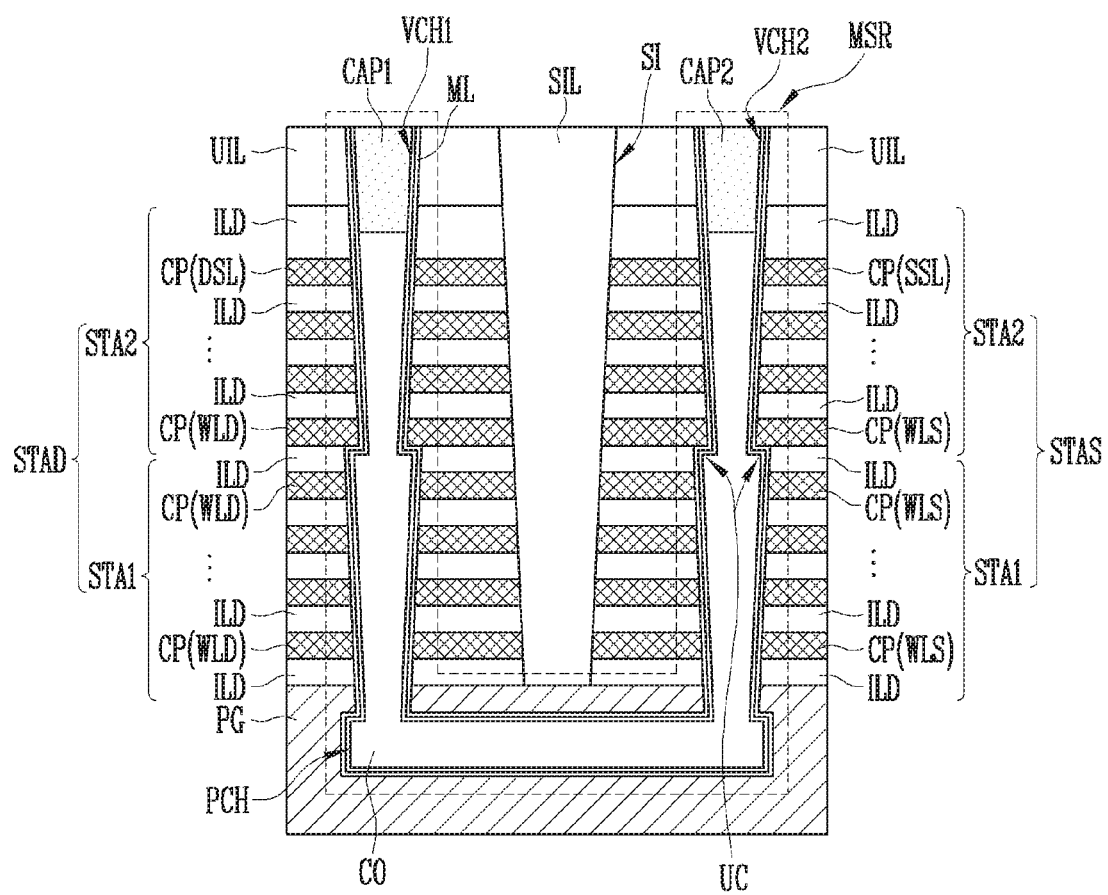

Referring to FIGS. 3A to 3D, memory strings MSR may each include memory cells stacked along each of the vertical channels VCH. The memory cells may be formed at intersections of the corresponding vertical channel VCH and the word lines WL. The vertical channels VCH may be coupled to a doped region SA disposed under the word lines WL as illustrated in FIGS. 3A to 3C. Alternatively, the vertical channels VCH may be coupled to a pipe channel PCH disposed under the word lines WL as illustrated in FIG. 3D.

Referring to FIGS. 3A to 3C, each of the vertical channels VCH may pass through a plurality of stack structures stacked on each other. Undercuts UC may be defined at boundaries between the plurality of stack structures. The undercuts UC may be defined in a hole in which each of the vertical channels VCH is disposed. Among the plurality of stack structures, a stack structure disposed at the lowermost layer may be defined as a first stack structure STA1, and a stack structure disposed at the uppermost layer may be defined as a second stack structure STA2. The second stack structure STA2 may be covered by an upper insulating layer UIL. The vertical channels VCH may extend to pass through the upper insulating layer UIL.

The plurality of stack structures may be divided into two groups including the first stack structure STA1 and the second stack structure STA2, respectively. The present disclosure is not limited thereto, and the plurality of stack structures may further include one or more stack structures disposed between the first stack structure STA1 and the second stack structure STA2 as well as the first stack structure STA1 and the second stack structure STA2.

Each of the plurality of stack structures may include interlayer insulating layers ILD and conductive patterns CP which are alternately stacked. Each interlayer insulating layer ILD may include an insulating material such as a silicon oxide layer. Each conductive pattern CP may include various conductive materials such as a doped silicon layer, a metal layer, a metal silicide layer, a barrier layer, and the like, and may include two or more types of conductive materials. The interlayer insulating layers ILD and the conductive patterns CP may be penetrated by the slit SI.

The slit SI may be filled with a sidewall insulating layer SWI and a source contact structure SC as illustrated in FIG. 3A, or may be filled with a slit insulating layer SIL as illustrated in FIGS. 3B and 3C.

Referring to FIGS. 3A and 3B, the conductive patterns CP may serve as a source select line SSL, the word lines WL, and a drain select line DSL. For example, the uppermost conductive pattern of the second stack structure STA2 may serve as the drain select line DSL, the lowermost conductive pattern of the first stack structure STA1 may serve as the source select line SSL. The conductive patterns CP between the source select line SSL and the drain select line DSL may serve as the word lines WL described with reference to FIGS. 2A to 2C. The conductive pattern which serves as the drain select line DSL is not limited to the uppermost conductive pattern of the second stack structure STA2. For example, each of the one or more conductive patterns successively disposed under the uppermost conductive pattern of the second stack structure STA2 may serve as the drain select line DSL. The conductive pattern which serves as the source select line SSL is not limited to the lowermost conductive pattern of the first stack structure STA1. For example, each of the one or more conductive patterns successively disposed above the lowermost conductive pattern of the first stack structure STA1 may serve as the source select line SSL.

Each of the vertical channels VCH may include a semiconductor layer. For example, each of the vertical channels VCH may include a silicon layer. The vertical channels VCH may directly contact the doped region SA. The doped region SA may include a source dopant. For example, the doped region SA may be a doped silicon layer including an n type dopant.

Referring to FIG. 3A, the doped region SA may be coupled to a sidewall of each of the vertical channels VCH. For example, the doped region SA may be disposed under the first stack structure STA1. The doped region SA may have a structure in which first, second, and third doped semiconductor layers SA1, SA2, and SA3 are stacked. The first, second, and third doped semiconductor layers SA1, SA2, and SA3 may include different conductivity type dopants, respectively or the same conductivity type dopant. For example, each of the first, second, and third doped semiconductor layers SA1, SA2, and SA3 may include an n type silicon layer including an n type dopant. The third doped semiconductor layer SA3 disposed between the first doped semiconductor layer SA1 and the second doped semiconductor layer SA2 may directly contact sidewalls of the vertical channels VCH.

Each of the vertical channels VCH may pass through the second doped semiconductor layer SA2 and the third doped semiconductor layer SA3 to extend into the first doped semiconductor layer SA1. The multilayer ML illustrated in FIG. 2B may extend along an outer wall of each of the vertical channels VCH illustrated in FIG. 3A, and may be divided into an upper pattern MLa and a lower pattern MLb by the third doped semiconductor layer SA3.

The sidewall insulating layer SWI may be formed on a sidewall of the slit SI. The slit SI and the sidewall insulating layer SWI may further pass through the third doped semiconductor layer SA3. The source contact structure SC in the slit SI may be insulated from the conductive patterns CP by the sidewall insulating layer SWI. The source contact structure SC may contact the doped region SA. For example, the source contact structure SC may pass through the second doped semiconductor layer SA2 and the third doped semiconductor layer SA3 to contact the first doped semiconductor layer SA1. The source contact structure SC may include various conductive materials such as a doped silicon layer, a metal layer, a metal silicide layer, a barrier layer, and the like, and may include two or more types of conductive materials. For example, the source contact structure SC may have a stack structure of a doped silicon layer contacting the first doped semiconductor layer SA1 and a metal layer formed on the doped silicon layer. The doped silicon layer may include an n type dopant and the metal layer may include a low-resistance metal such as tungsten to lower resistance. A core region of each of the vertical channels VCH may be filled with a core insulating layer CO and a doped semiconductor pattern CAP. The doped semiconductor pattern CAP may serve as a drain junction.

Referring to FIG. 3B, the doped region SA may be coupled to a bottom surface of each of the vertical channels VCH. For example, the doped region SA may be disposed under the first stack structure STA1 and include an n type silicon layer including an n type dopant.

Each of the vertical channels VCH may extend along a top surface of the doped region SA. The multilayer ML illustrated in FIG. 2B may extend along a sidewall of each of the vertical channels VCH illustrated in FIG. 3B, and each of the vertical channels VCH may pass through the multilayer ML to contact the doped region SA.

A core region of each of the vertical channels VCH may be filled with the core insulating layer CO and the doped semiconductor pattern CAP. The doped semiconductor pattern CAP may serve as a drain junction.

Referring to FIG. 3C, a lower stack structure LST may be disposed between the first stack structure STA1 and the doped region SA. The lower stack structure LST may include a lower insulating layer LIL and the source select line SSL which are alternately stacked. The source select line SSL may be disposed at a single layer or at each of two or more layers.

Referring to FIG. 3C, the conductive patterns CP included in the first and second stack structures STA1 and STA2 may serve as the word lines WL and the drain select line DSL. A conductive pattern which is the same as the conductive pattern as described with reference to FIGS. 3A and 3B may serve as the drain select line DSL. The conductive patterns CP disposed between the drain select line DSL and the source select line SSL may serve as the word lines WL.

The lower stack structure LST may be penetrated by lower channels LPC. The lower channels LPC may be aligned under the vertical channels VCH, respectively, and may be coupled to the vertical channels VCH, respectively. The lower channels LPC may be formed by a growth method using an epitaxial process and the like, or by a deposition method. The lower channels LPC may directly contact the doped region SA. Each of the vertical channels VCH may be electrically coupled to the doped region SA via the corresponding lower channel LPC. Each of the lower channels LPC may serve as a channel layer of a source select transistor coupled to the source select line SSL. Each of the lower channels LPC may be surrounded by a gate insulating layer GI. Each of the lower channels LPC may be a doped silicon layer to which an impurity is doped. Each of the lower channels LPC may include an n type dopant.

The multilayer ML having a structure as illustrated in FIG. 2B may extend along a sidewall of each of the vertical channels VCH and enclose each of the vertical channels VCH. Each of the vertical channels VCH may pass through the multilayer ML to directly contact the corresponding lower channel LPC. A core region of each of the vertical channels VCH may be filled with the core insulating layer CO and the doped semiconductor pattern CAP. The core insulating layer CO may be disposed between the corresponding lower channel LPC and the doped semiconductor pattern CAP, and the doped semiconductor pattern CAP may serve as a drain junction.

According to a structure illustrated in FIGS. 3A to 3C, the memory string MSR may include memory cells and a drain select transistor which are coupled in series along each of the vertical channels VCH. The memory cells may be formed at intersections of each of the vertical channels VCH and the word lines WL, and the drain select transistor may be formed at an intersection of each of the vertical channels VCH and the drain select line DSL.

The memory string MSR may further include a source select transistor coupled in series to the memory cells. The source select transistor may be formed at an intersection of each of the vertical channels VCH and the source select line SSL under the memory cells as illustrated in FIGS. 3A and 3B, or at an intersection of each of the lower channels LPC and the source select line SSL under the memory cells as illustrated in FIG. 3C.

Referring to FIG. 3D, the memory string MSR may be defined along the pipe channel PCH and at least two vertical channels VCH1 and VCH2 coupled to the pipe channel PCH. Hereinafter, for convenience of explanation, an example in which the memory string MSR includes the first vertical channel VCH1 and the second vertical channel VCH2 which are coupled to the pipe channel PCH to be defined as a U type will be described.

The first vertical channel VCH1 may pass through a drain side stack structure STAD and the second vertical channel VCH2 may pass through a source side stack structure STAS. The drain side stack structure STAD and the source side stack structure STAS may be the same layers and disposed at the same level to each other. The drain side stack structure STAD may be spaced apart from the source side stack structure STAS by the slit SI and the silt insulating layer SIL filling the slit SI.

The drain side stack structure STAD and the source side stack structure STAS may include a plurality of stack structures stacked thereon, respectively. The undercut UC may be defined between each of the boundaries of the plurality of stack structures. The undercut UC may be defined in a hole in which each of the first and second vertical channels VCH1 and VCH2 is disposed.

Each of the plurality of stack structures may include the interlayer insulating layers ILD and the conductive patterns CP which are alternately stacked. The interlayer insulating layers ILD and the conductive patterns CP may include materials which are the same as the materials as described with reference to FIGS. 3A to 3C. As defined in FIGS. 3A to 3C, among the plurality of stack structures, the stack structure disposed at the lowermost layer may be defined as the first stack structure STA1, and the stack structure disposed at the uppermost layer may be defined as the second stack structure STA2.

The second stack structure STA2 may be covered by the upper insulating layer UIL. Each of the first and second vertical channels VCH1 and VCH2 may extend to pass through the upper insulating layer UIL.

The conductive patterns CP of the drain side stack structure STAD may serve as the drain select line DSL and drain side word lines WLD. The conductive patterns CP of the source side stack structure STAS may serve as the source select line SSL and source side word lines WLS.

The drain select line DSL may be the uppermost conductive pattern of the second stack structure STA2 which constitutes the drain side stack structure STAD. In another example, the uppermost conductive pattern and each of the one or more conductive patterns successively disposed under the uppermost conductive pattern may further serve as the drain select line DSL. The drain side word lines WLD may be the conductive patterns disposed under the drain select line DSL.

The source select line SSL may be the uppermost conductive pattern of the second stack structure STA2 which constitutes the source side stack structure STAS. In another example, the uppermost conductive pattern and each of the one or more conductive patterns successively disposed under the uppermost conductive pattern may serve as the source select line SSL. The source side word lines WLS may be the conductive patterns disposed under the source select line SSL.

The pipe channel PCH may be embedded in a pipe gate PG disposed under the drain side stack structure STAD and the source side stack structure STAS. The pipe gate PG may include various conductive materials. For example, the pipe gate PG may include doped silicon layers stacked as a multilayer. The pipe gate PG may extend to overlap the slit SI and the slit insulating layer SIL.

The pipe channel PCH may be integrated with the first vertical channel VCH1 and the second vertical channel VCH2 and serve as a channel of the memory string MSR. A channel layer including the pipe channel PCH, the first vertical channel VCH1, and the second vertical channel VCH2 may include a semiconductor layer such as silicon.

The multilayer ML may extend along an outer wall of the channel layer including the pipe channel PCH, the first vertical channel VCH1, and the second vertical channel VCH2. The multilayer ML may include material layers which are the same as the material layers as described with reference to FIG. 2B. Core regions of each of the pipe channel PCH, the first vertical channel VCH1, and the second vertical channel VCH2 may be filled with the core insulating layer CO. The core insulating layer CO may have a lower height than the first vertical channel VCH1 and the second vertical channel VCH2. First and second doped semiconductor patterns CAP1 and CAP2 may be disposed on opposite ends of the core insulating layer CO, respectively. The first doped semiconductor pattern CAP1 may be surrounded by the first vertical channel VCH1 and serve as a drain junction. The second doped semiconductor pattern CAP2 may be surrounded by the second vertical channel VCH2 and serve as a source junction.

Each of the first and second doped semiconductor patterns CAP1 and CAP2 may include a doped silicon layer.

According to the structure illustrated in FIG. 3D, a drain select transistor may be formed at an intersection of the first vertical channel VCH1 and the drain select line DSL, and drain side memory cells may be formed at intersections of the first vertical channel VCH1 and the drain side word lines WLD. The drain side memory cells and the drain select transistor may be coupled in series by the first vertical channel VCH1.

In addition, a source select transistor may be formed at an intersection of the second vertical channel VCH2 and the source select line SSL, and source side memory cells may be formed at intersections of the second vertical channel VCH2 and the source side word lines WLS. The source side memory cells and the source select transistor may be coupled in series by the second vertical channel VCH2.

The source side memory cells and the drain side memory cells may be coupled in series by a pipe transistor formed at an intersection of the pipe channel PCH and the pipe gate PG.

As a result, the memory string MSR illustrated in FIG. 3D may include the drain select transistor, the drain side memory cells, the pipe transistor, the source side memory cells, and the source select transistor coupled in series by the channel layer including the pipe channel PCH, the first vertical channel VCH1, and the second vertical channel VCH2.

In order to increase integration density of the memory string MSR described with reference to FIGS. 3A to 3D, the number of memory cells to be stacked may be increased. Hereinafter, various manufacturing methods of a semiconductor device by which stability of a process may be increased and a level of difficulty of the process may be decreased even if the number of memory cells to be stacked is increased will be described.

FIGS. 4A to 4C, 5A to 5F, 6A, 6B, and 7A to 7D are cross-sectional views illustrating a manufacturing method of a semiconductor device according to an embodiment of the present disclosure.

Figure 4A:
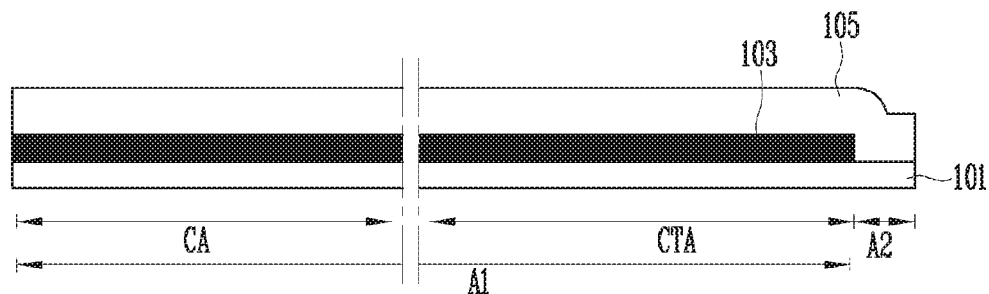
FIGS. 4A to 4C, 5A to 5F, 6A, 6B, and 7A to 7D are cross-sectional views illustrating a manufacturing method of a semiconductor device according to an embodiment of the present disclosure.
Figure 4B:
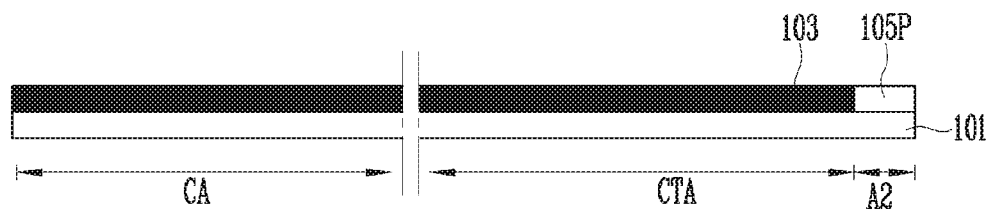
Figure 4C:
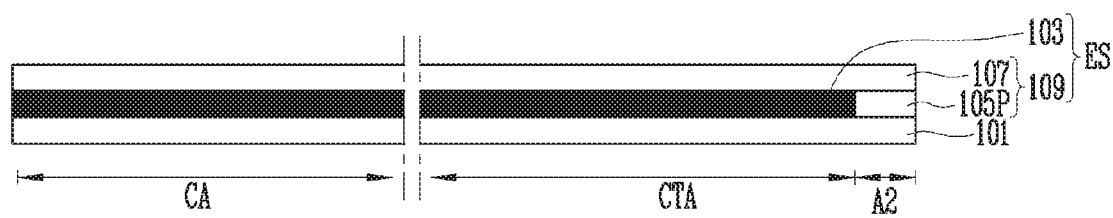

FIGS. 4A to 4C are cross-sectional views illustrating processes of forming a lower etch stop structure.

Referring to FIG. 4A, a first etch stop pattern 103 may be formed on a lower structure 101 including the first region A1 and the second region A2. The lower structure 101 may include the substrate SUB and the peripheral circuit structure PC which are illustrated in FIG. 1. The lower structure 101 may further include various structures depending on a structure of a memory string to be formed. For example, the lower structure 101 may further include the doped region SA illustrated in FIG. 3B, the lower stack structure LST illustrated in FIG. 3C, or the pipe gate illustrated in FIG. 3D. An insulating layer may be disposed at the uppermost layer of the lower structure 101.

The first region A1 and the second region A2 of the lower structure 101 may correspond to the first region A1 and the second region A2 which are illustrated in FIG. 1. The first region A1 of the lower structure 101 may be divided into a cell array region CA and a contact region CTA. The cell array region CA may be overlapped by the vertical channels VCH illustrated in FIG. 2A and the contact region CTA may be overlapped by the pad portions PP illustrated in FIG. 2C. The second region A2 of the lower structure 101 may not be overlapped by the word lines WL, the drain select line DSL, and the source select line SSL which are illustrated in FIGS. 3A to 3D.

The first etch stop pattern 103 may include a material layer having a different etch rate from material layers which constitute a plurality of stack structures to be formed later. The first etch stop pattern 103 may include a material layer having a significantly different etch rate from the stack structures so as to decrease a slope of an etched surface of a hole or a slit during subsequent processes for forming the hole or the slit which pass through the stack structures. For example, the first etch stop pattern 103 may include a material layer having a significantly different etch rate from an oxide layer and a nitride layer than a polysilicon layer. Considering these etch rates, the first etch stop pattern 103 may include metal. For example, the first etch stop pattern 103 may include a titanium (Ti) compound, for example, a titanium nitride (TiN) layer.

The first etch stop pattern 103 may be formed to cover the first region A1 of the lower structure 101 and expose the second region A2 of the lower structure 101. According to embodiments of the present disclosure, the first etch stop pattern 103 including metal may not remain in the second region A2 and the first etch stop pattern 103 may be formed before forming a stepped stack structure. Thereby, even if a contact plug (not illustrated) is disposed at the second region A2, a phenomenon in which the contact plug disposed at the second region A2 is electrically coupled to the first etch stop pattern 103 to cause a defect in a semiconductor device may be prevented.

Subsequently, an insulating layer 105 may be formed to cover the first etch stop pattern 103 and the second region A2 of the lower structure 101. The insulating layer 105 may include an oxide layer.

Referring to FIG. 4B, to planarize a surface of the insulating layer 105 shown in FIG. 4A, a planarizing process such as Chemical Mechanical Polishing (CMP) may be performed. Thereby, a surface of the first etch stop pattern 103 may be exposed, and an insulating pattern 105P covering the second region A2 and having a flat surface may be formed.

Referring to FIG. 4C, an insulating layer 107 covering the first etch stop pattern 103 and the insulating pattern 105P may be further deposited. The insulating layer 107 may include an oxide layer. The insulating pattern 105P and the insulating layer 107 may serve as first interlayer insulating layers 109. The first interlayer insulating layer 109 may cover the first etch stop pattern 103 and the second region A2 of the lower structure 101 and may have a flat surface.

Through the processes as described in FIGS. 4A to 4C, a lower etch stop structure ES including the first etch stop pattern 103 and the first interlayer insulating layer 109 may be formed on the lower structure 101.

FIGS. 5A to 5F are cross-sectional views illustrating processes of forming a plurality of stack structures penetrated by a vertical channel on the lower etch stop structure ES.

Figure 5A:
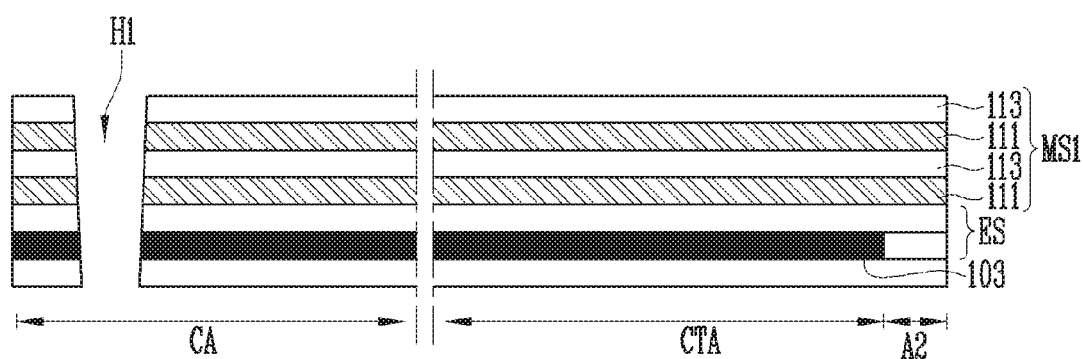

Referring to FIG. 5A, a first stack structure MS1 may be formed on the lower etch stop structure ES. The first stack structure MS1 may be formed by alternately stacking first sacrificial layers 111 and first interlayer insulating layers 113 on the lower etch stop structure ES. The first sacrificial layers 111 and the first interlayer insulating layers 113 may extend to overlap the first etch stop pattern 103 and the second region A2. The first sacrificial layers 111 and the first interlayer insulating layers 113 may include different materials.

The first interlayer insulating layers 113 may insulate conductive patterns from each other, and may have a high etch resistance with respect to an etching material during an etching process for selectively removing the first sacrificial layers 111. For example, the first interlayer insulating layers 113 may include oxide layers such as a silicon oxide layer and the first sacrificial layers 111 may include nitride layers such as a silicon nitride layer.

Subsequently, a first hole H1 passing through the first stack structure MS1 on the cell array region CA may be formed. The first hole H1 may extend to further pass through the first etch stop pattern 103. A width of a lower end of the first hole H1 may be increased using a difference in etch rate between the first etch stop pattern 103, and the first interlayer insulating layers 113 and the first sacrificial layers 111 of the first stack structure MS1. Thereby, a difference in width between an upper end and the lower end of the first hole H1 may be decreased. Since the first etch stop pattern 103 includes metal, the first etch stop pattern 103 may have a high etch resistance with respect to an etching material which etches the first stack structure MS1. Thereby, a level of difficulty of an etching process for forming the first hole H1 may be lowered and the etching process may stably proceed.

Figure 5B:
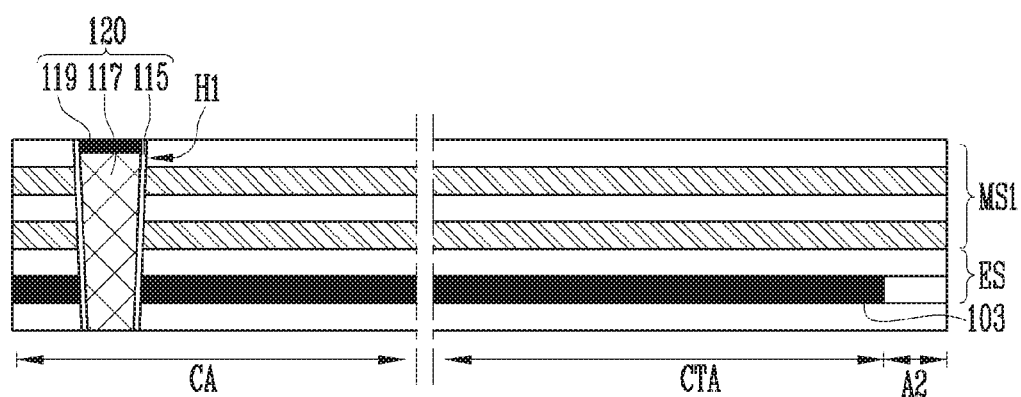

Referring to FIG. 5B, a sacrificial pillar 120 may be formed in the first hole H1. Processes for forming the sacrificial pillar 120 may include forming a protective oxide layer 115 on a surface of the first hole H1, forming a metal layer 117 filling a portion of the first hole H1 on the protective oxide layer 115, and forming a second etch stop pattern 119 filling an upper portion of the first hole H1 on the metal layer 117. The metal layer 117 may include metal having strength capable of withstanding process stress, for example, tungsten (W). The second etch stop pattern 119 may include the same material as the first etch stop pattern 103.

Figure 5C:
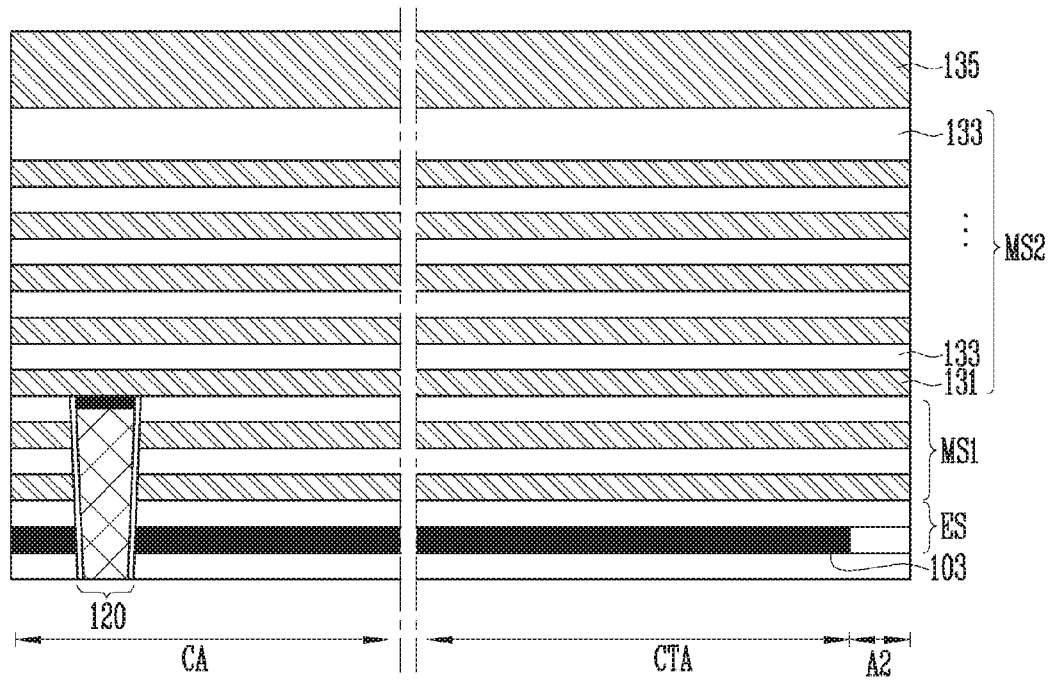

Referring to FIG. 5C, a second stack structure MS2 may be formed on the first stack structure MS1 so as to cover the sacrificial pillar 120. The second stack structure MS2 may be formed by alternately stacking second sacrificial layers 131 and second interlayer insulating layers 133 on the first stack structure MS1. The second sacrificial layers 131 and the second interlayer insulating layers 133 may extend to overlap the first etch stop pattern 103 and the second region A2. The second sacrificial layers 131 may include the same material as the first sacrificial layers 111, and the second interlayer insulating layers 133 may include the same material as the first interlayer insulating layers 113.

Subsequently, a mask layer 135 may be formed on the second stack structure MS2. The mask layer 135 may include a nitride layer such as a silicon nitride layer.

Figure 5D:
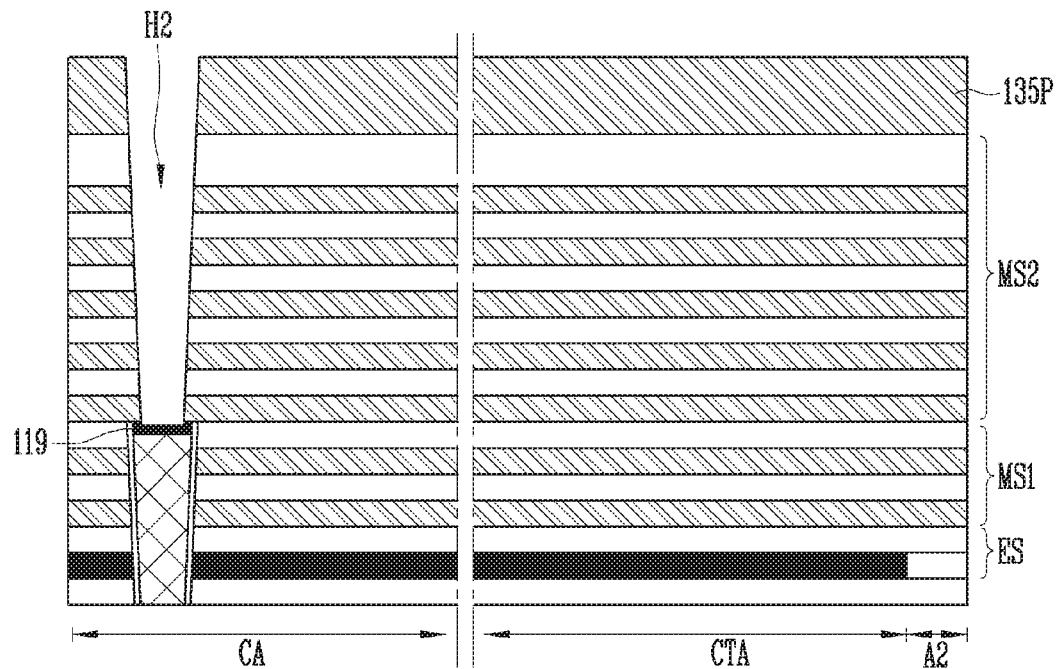

Referring to FIG. 5D, a mask pattern 135P may be formed by patterning the mask layer 135 illustrated in FIG. 5C by using a photolithography process. Thereafter, a second hole H2 exposing the second etch stop pattern 119 may be formed by etching the second stack structure MS2 exposed by the mask pattern 135P.

During an etching process for forming the second hole H2, the second etch stop pattern 119 may serve as an etch stop layer. A width of a lower end of the second hole H2 may be increased using a difference in etch rate between the second etch stop pattern 119, and the second interlayer insulating layers 133 and the second sacrificial layers 131 of the second stack structure MS2. Thereby, a difference in width between an upper end and the lower end of the second hole H2 may be decreased. Since the second etch stop pattern 119 includes metal, the second etch stop pattern 119 may have a high etch resistance with respect to an etching material which etches the second stack structure MS2. Thereby, a level of difficulty of an etching process for forming the second hole H2 may be lowered and the etching process may stably proceed.

Figure 5E:
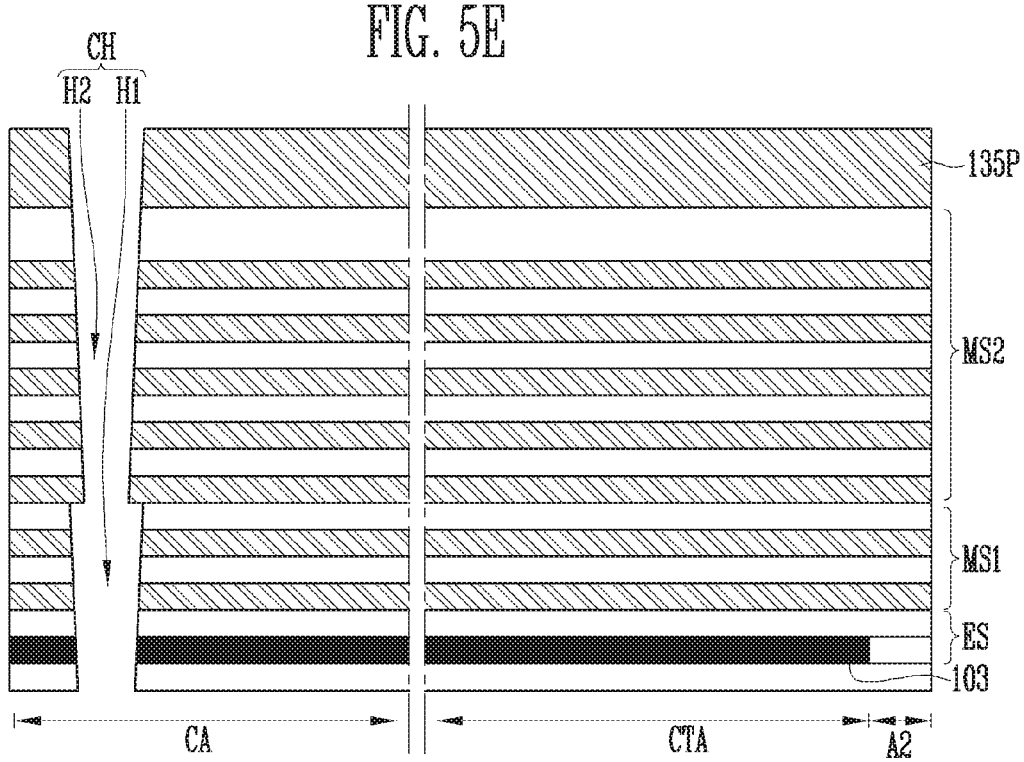

Referring to FIG. 5E, the first hole H1 may be opened by removing the sacrificial pillar through the second hole H2. Thereby, the first hole H1 and the second hole H2 may be coupled to each other to define a channel hole CH.

Figure 5F:
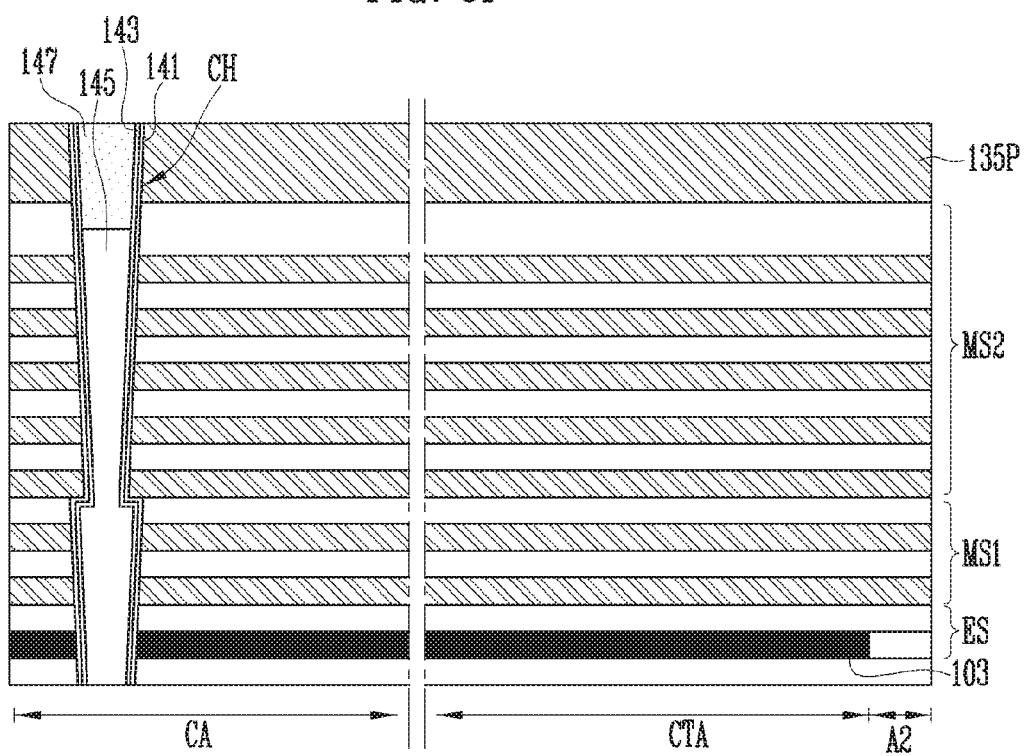

Referring to FIG. 5F, a multilayer 141 may be formed on a surface of the channel hole CH. The multilayer 141 may have a structure consistent with embodiments described with reference to FIG. 2B. Thereafter, a channel layer 143 may be formed on the multilayer 141. The channel layer 143 may serve as a vertical channel layer. The channel layer 143 may include a semiconductor layer. Thereafter, a core insulating layer 145 and a doped semiconductor pattern 147 filling a central region of the channel hole CH may be formed on the channel layer 143. The doped semiconductor pattern 147 may fill the central region of the channel hole CH on the core insulating layer 145.

Although FIGS. 5A to 5F illustrate an embodiment in which the channel layer 143 passing through the first stack structure MS1 and the second stack structure MS2 is formed, embodiments of the present disclosure are not limited thereto. For example, one or more stack structures may be further disposed between the first stack structure MS1 and the second stack structure MS2.

Figure 6A:
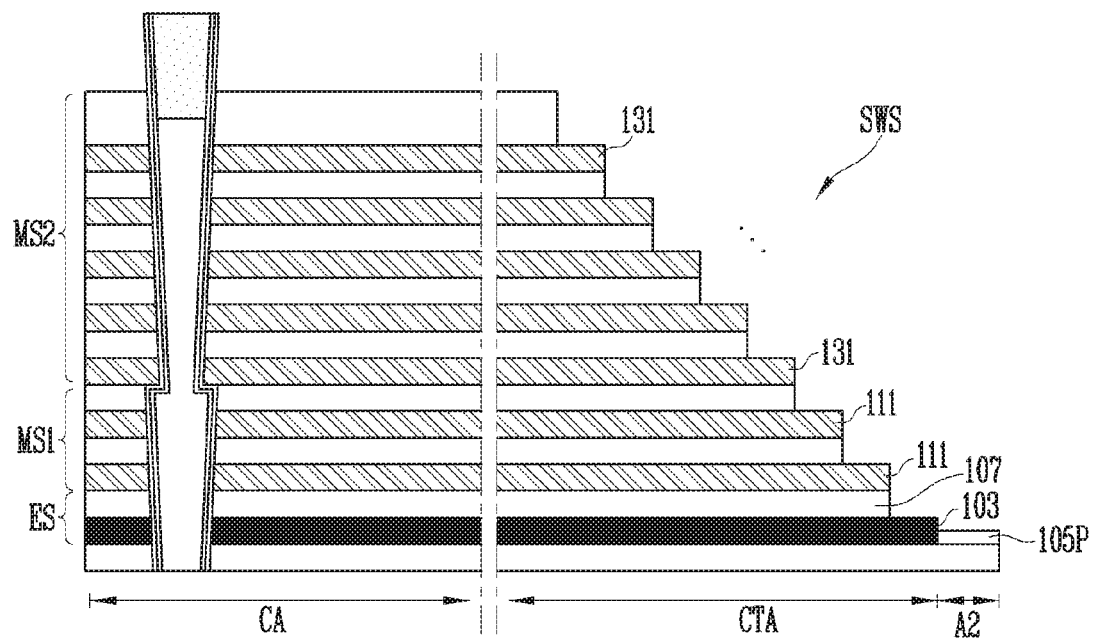
Figure 6B:
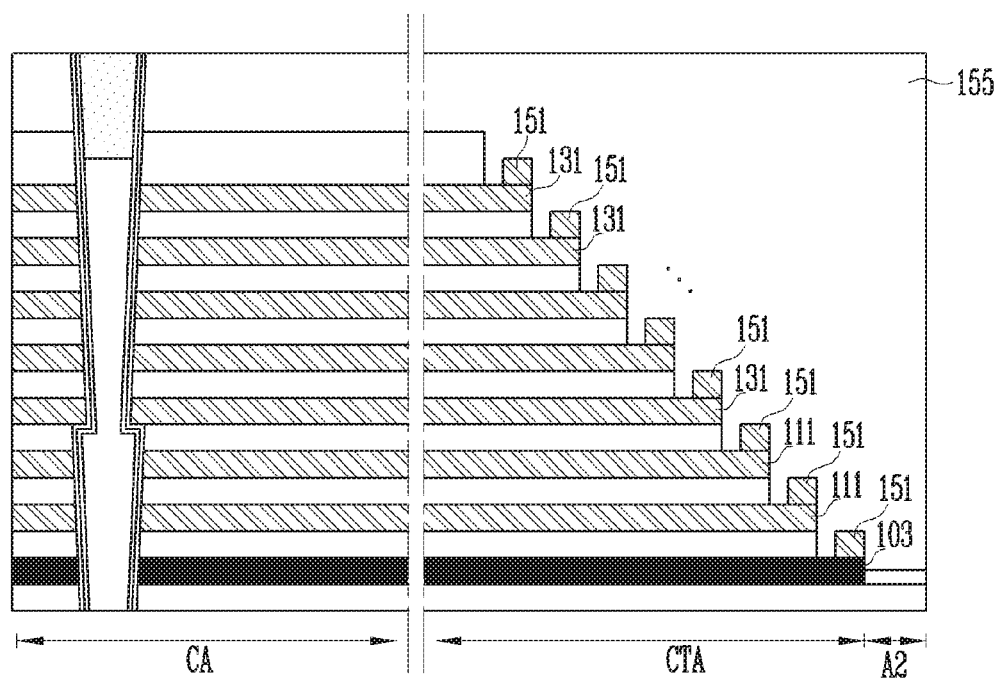

FIGS. 6A and 6B are cross-sectional views illustrating processes of forming a stepped stack structure and processes of forming sacrificial pad patterns.

Referring to FIG. 6A, the second stack structure MS2 and the first stack structure MS1 may be patterned (e.g. etched) to have stepped end portions SWS disposed on the contact region CTA. After forming the stepped end portions SWS, the mask pattern 135P illustrated in FIG. 5F may be removed.

The stepped end portions SWS may expose an end portion of the first etch stop pattern 103. The stepped end portions SWS may be defined as end portions of the first sacrificial layers 111 of the first stack structure MS1 and end portions of the second sacrificial layers 131 of the second stack structure MS2. When the first stack structure MS1 and the second stack structure MS2 are patterned (e.g. etched) to form the stepped stack structure, the first stack structure MS1 and the second stack structure MS2 may be removed from the second region A2. In an embodiment, removal (e.g. by etching) of the first stack structure MS1 and the second structure MS2 from the second region A2 may expose the second region A2. In an embodiment, removal (e.g. by etching) of the first stack structure MS1, the second structure MS2, and the insulating layer 107 from the second region A2 may expose the insulating pattern 105P over the second region A2.

Referring to FIG. 6B, sacrificial pad patterns 151 may be formed on the end portion of the first etch stop pattern 103 which is exposed by the stepped stack structure and on the end portions of the first sacrificial layers 111 and the end portions of the second sacrificial layers 131 which are patterned to have the step shape.

Processes for forming the sacrificial pad patterns 151 may include forming a sacrificial pad layer deposited on the first etch stop pattern 103 exposed by the stepped stack structure, the first sacrificial layers 111, and the second sacrificial layers 131 and etching a portion of the sacrificial pad layer. The sacrificial pad layer may include the same nitride layer as the first and second sacrificial layers 111 and 131. The sacrificial layer may be etched by a wet etching process using phosphoric acid, and the sacrificial layer may be divided into the plurality of sacrificial pad patterns 151 through the etching process of the sacrificial pad layer.

The first etch stop pattern 103, which includes a material having a high etch resistance with respect to the etching process for forming the sacrificial pad patterns 151 as described above, may protect a structure disposed under the first etch stop pattern 103 during the etching process for forming the sacrificial pad patterns 151.

Subsequently, an upper insulating layer 155 covering the sacrificial pad patterns 151 and the stepped stack structure may be formed. A surface of the upper insulating layer 155 may be planarized.

FIGS. 7A to 7D are cross-sectional views illustrating replacement processes through a slit.

Figure 7A:
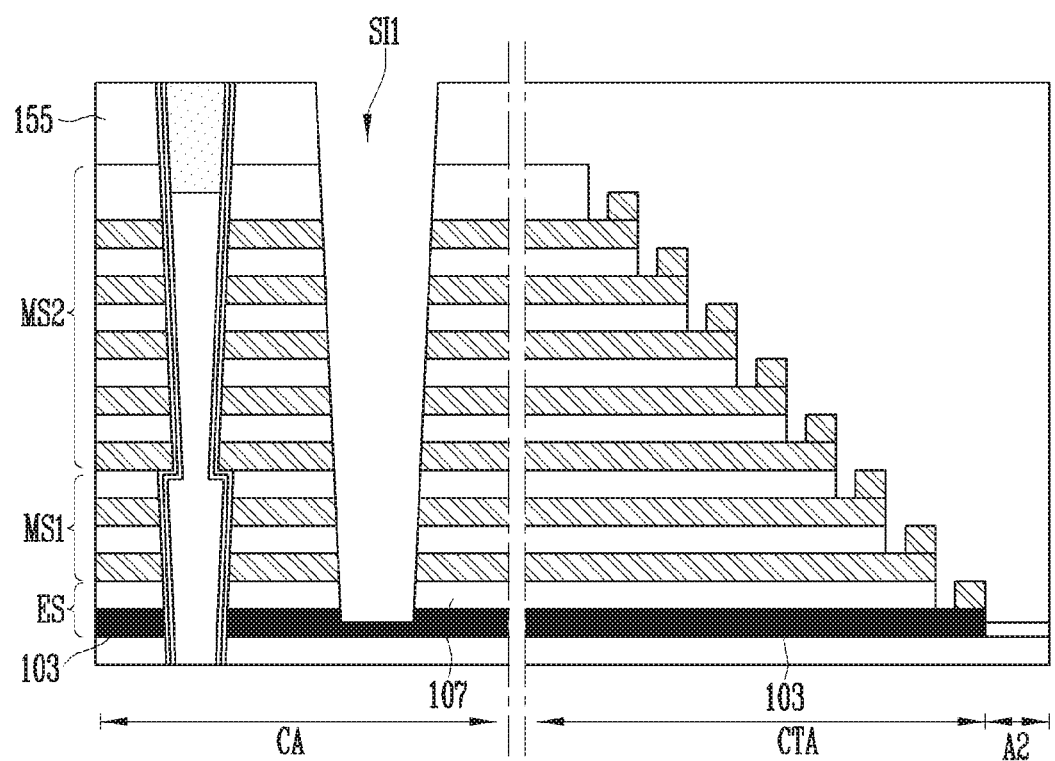

Referring to FIG. 7A, a first slit SI1 passing through the first stack structure MS1 and the second stack structure MS2 on the cell array region CA may be formed. The first slit SI1 may further pass through the upper insulating layer 155. The first etch stop pattern 103 of the lower etch stop structure ES may serve as an etch stop layer during the first etching process for forming the first slit SIL. In an embodiment, the first slit SI1 may also further pass through the insulating layer 107 of the lower etch stop structure ES. A difference in width between a lower end of the first slit SI1 and an upper end of the first slit SI1 may be decreased using a large difference in etch rate between material layers of the first stack structure MS1 and the second stack structure MS2 which are etched during the first etching process, and the first etch stop pattern 103 including metal.

Figure 7B:
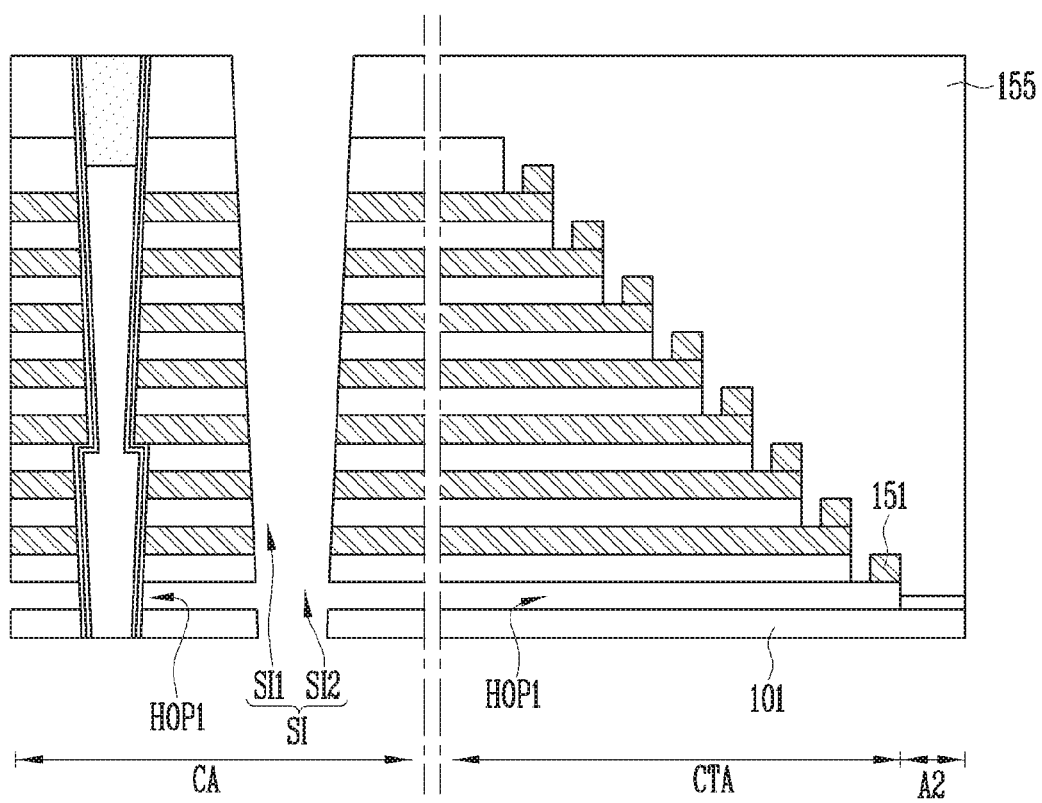

Referring to FIG. 7B, a second slit SI2 may be formed by etching the first etch stop pattern, exposed by the first slit SI1, by the second etching process. Thereby, the slit SI including the first slit SI1 and the second slit SI2 may be defined.

Subsequently, a first horizontal opening HOP1 may be formed by selectively removing the first etch stop pattern through the slit SI.

Figure 7C:
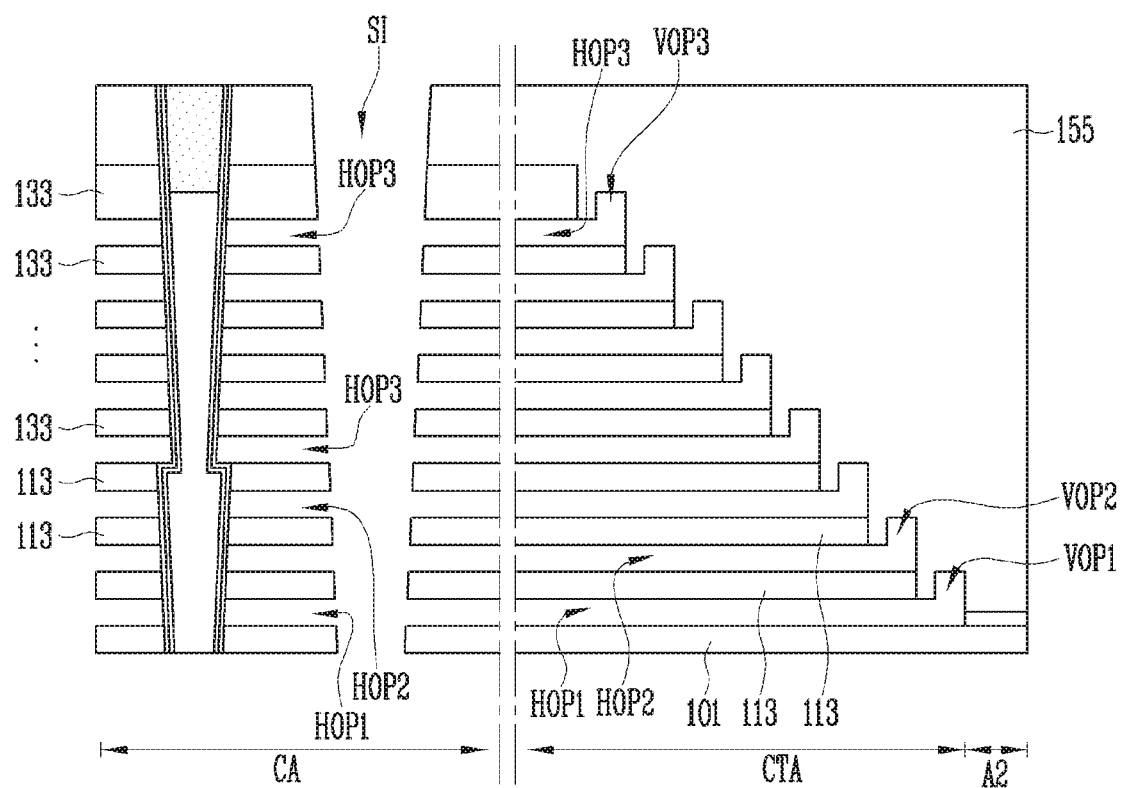

Referring to FIG. 7C, the first sacrificial layers of the first stack structure and the second sacrificial layers of the second stack structure may be selectively removed through the slit SI. Regions from which the first sacrificial layers of the first stack structure are removed may be defined as second horizontal openings HOP2 and regions from which the second sacrificial layers of the second stack structure are removed may be defined as third horizontal openings HOP3. When the first and second sacrificial layers are removed, sacrificial pad patterns including the same material as the first and second sacrificial layers may be removed. Regions from which the sacrificial pad patterns are removed may be divided into first, second, and third vertical openings VOP1, VOP2, and VOP3.

The first vertical opening VOP1 may be coupled to an end portion of the first horizontal opening HOP1 on the contact region CTA; the second vertical openings VOP2 may be coupled to end portions of the second horizontal openings HOP2 on the contact region CTA, respectively; and the third vertical openings VOP3 may be coupled to end portions of the third horizontal openings HOP3 on the contact region CTA, respectively.

Figure 7D:
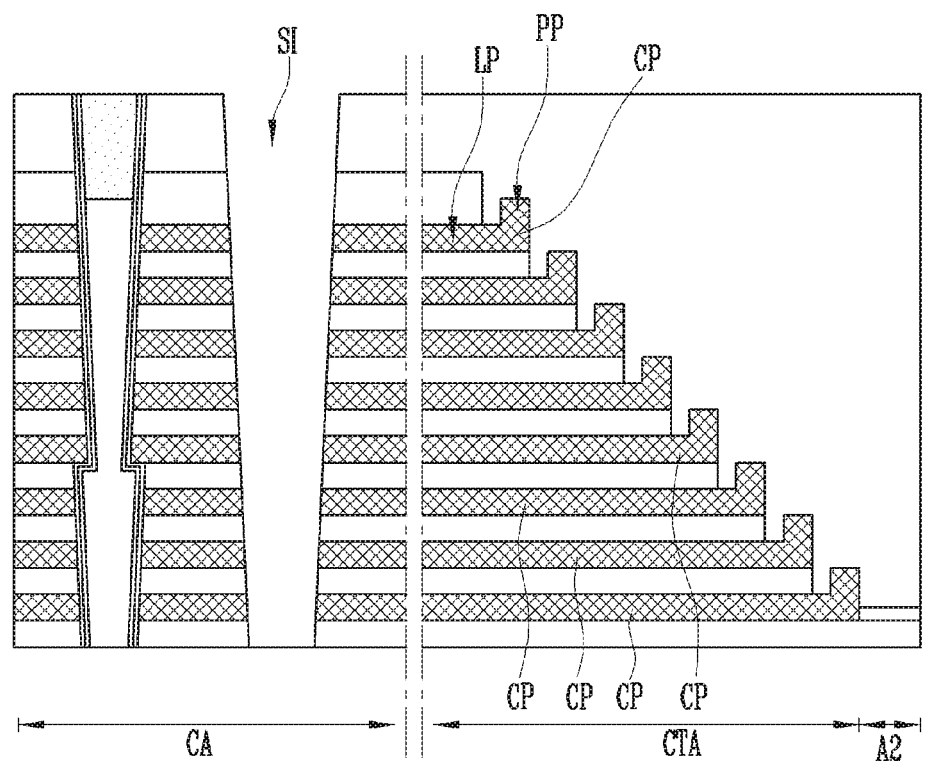

Referring to FIG. 7D, after filling the first, second, and third vertical openings VOP1, VOP2, and VOP3 and the first, second, and third horizontal openings HOP1, HOP2, and HOP3 illustrated in FIG. 7C with conductive materials, the conductive patterns may be divided into a plurality of conductive patterns CP through the slit SI.

Each of the conductive patterns CP may include at least one of a doped silicon layer, a metal silicide layer, and a metal layer. A low-resistance metal such as tungsten may be used for each of the conductive patterns CP for low resistance wiring. Each of the conductive patterns CP may further include a barrier layer such as a titanium nitride layer, a tungsten nitride layer, a tantalum nitride layer, and the like. Each of the conductive patterns CP may include the line portion LP extending from the cell array region CA to the contact region CTA and the pad portion PP extending from an end portion of the line portion LP and having a greater thickness than the line portion LP.

The conductive patterns CP may correspond to the conductive patterns CP shown in FIGS. 3A to 3D.

The above-described manufacturing method of the semiconductor device according to an embodiment of the present disclosure may be used to form the memory string illustrated in FIGS. 3A to 3D.

FIGS. 8A to 8E are cross-sectional views illustrating a manufacturing method of a semiconductor device according to an embodiment of the present disclosure. For example, FIGS. 8A to 8E may be cross-sectional views illustrating a method for forming the memory string illustrated in FIG. 3A. Hereinafter, a detailed description of any repetitive processes described above will be omitted.

Figure 8A:
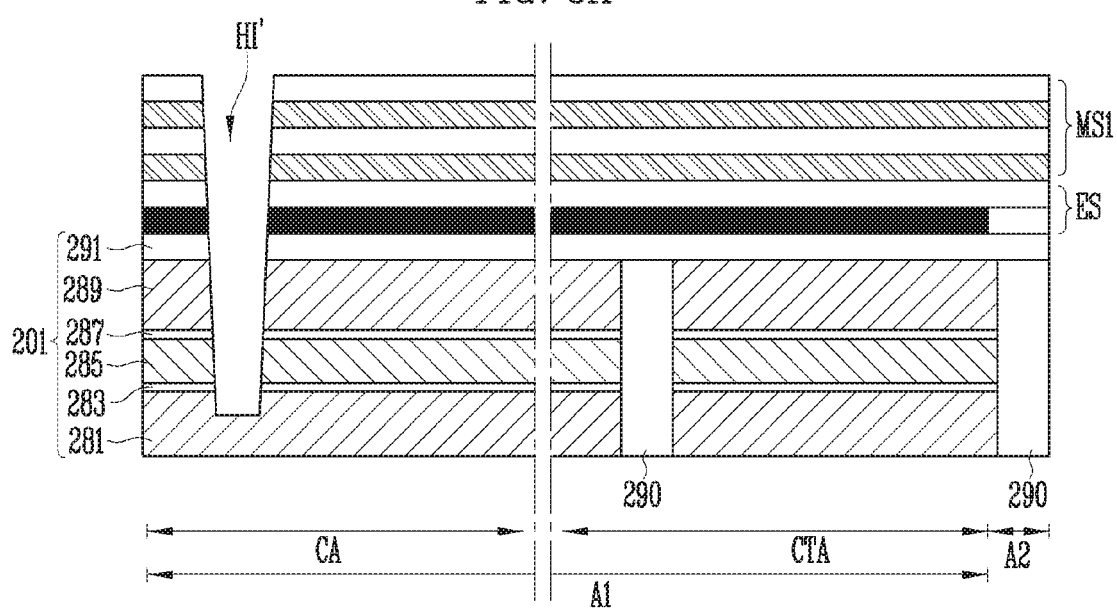
FIGS. 8A to 8E are cross-sectional views illustrating a manufacturing method of a semiconductor device according to an embodiment of the present disclosure.

Referring to FIG. 8A, a lower structure 201 including the first region A1 and the second region A2 is formed. The lower structure 201 may include a stack structure of a first doped semiconductor layer 281, a first protective layer 283, a source sacrificial layer 285, a second protective layer 287, a second doped semiconductor layer 289 and an interlayer insulating layer 291. The first doped semiconductor layer 281 and the second doped semiconductor layer 289 may include doped silicon layers. The first protective layer 283 and the second protective layer 287 may include oxide layers. The source sacrificial layer 285 may include an undoped semiconductor layer, for example, an undoped silicon layer.

The first doped semiconductor layer 281, the first protective layer 283, the source sacrificial layer 285, the second protective layer 287, and the second doped semiconductor layer 289 may be penetrated by isolation layer 290.

The lower etch stop structure ES may be formed on the lower structure 201 illustrated in FIG. 8A using the processes described with reference to FIGS. 4A to 4C.

Thereafter, the first stack structure MS1 may be formed on the lower etch stop structure ES by a process which is the same as the process described with reference to FIG. 5A. Subsequently, a first hole H1' passing through the first stack structure MS1 may be formed. The first hole H1' may further pass through the interlayer insulating layer 291, the second doped semiconductor layer 289, the second protective layer 287, the source sacrificial layer 285, and the first protective layer 283 disposed under the lower etch stop structure ES at the cell array region CA to extend into the first doped semiconductor layer 281.

Figure 8B:
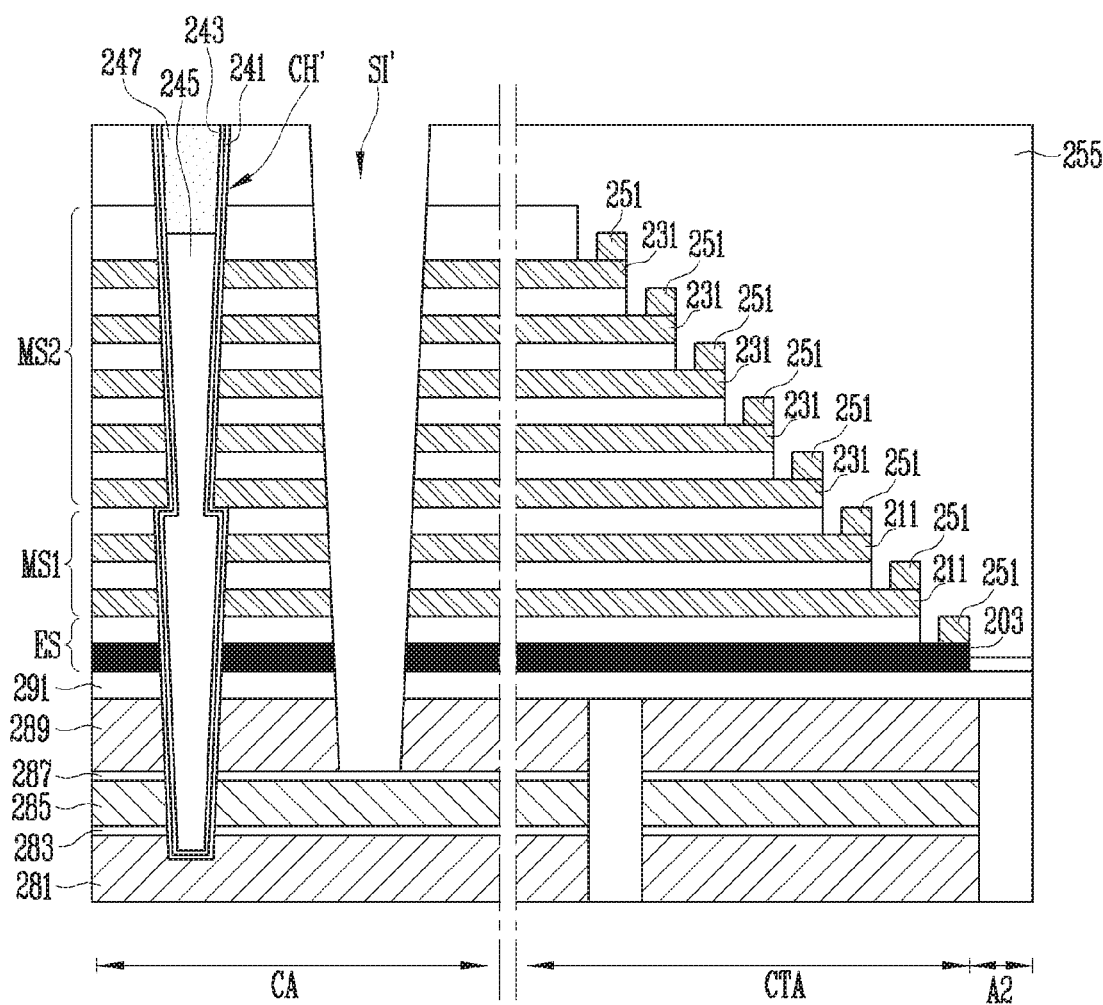

Referring to FIG. 8B, a plurality of stack structures penetrated by a channel hole CH' may be formed and a multilayer 241 and a channel layer 243 may be formed on a surface of the channel hole CH' by using the processes described with reference to FIGS. 5D to 5F. Thereafter, a core insulating layer 245 and a doped semiconductor pattern 247 which are disposed on the channel layer 243 and filling a central region of the channel hole CH' may be formed.

Each of the channel hole CH', the core insulating layer 245, the channel layer 243, and the multilayer 241 may pass through the second doped semiconductor layer 289, the second protective layer 287, the source sacrificial layer 285, and the first protective layer 283 to extend into the first doped semiconductor layer 281.

Subsequently, a stepped stack structure having a stepped end portion may be formed on the contact region CTA and sacrificial pad patterns 251 may be formed on the stepped end portion and an end portion of a first etch stop pattern 203 by using the processes described with reference to FIGS. 6A and 6B. The stepped end portion may be defined by end portions of first sacrificial layers 211 of the stack structure MS1 and end portions of second sacrificial layers 231 of the second stack structure MS2. Subsequently, an upper insulating layer 255 may be formed.

Thereafter, a slit SI' may be formed using the processes described with reference to FIGS. 7A and 7B. The slit SI' may pass through the upper insulating layer 255, the second stack structure MS2, the first stack structure MS1, and the lower etch stop structure ES. In addition thereto, the slit SI' may pass through the interlayer insulating layer 291 and the second doped semiconductor layer 289 to expose the second protective layer 287.

Figure 8C:
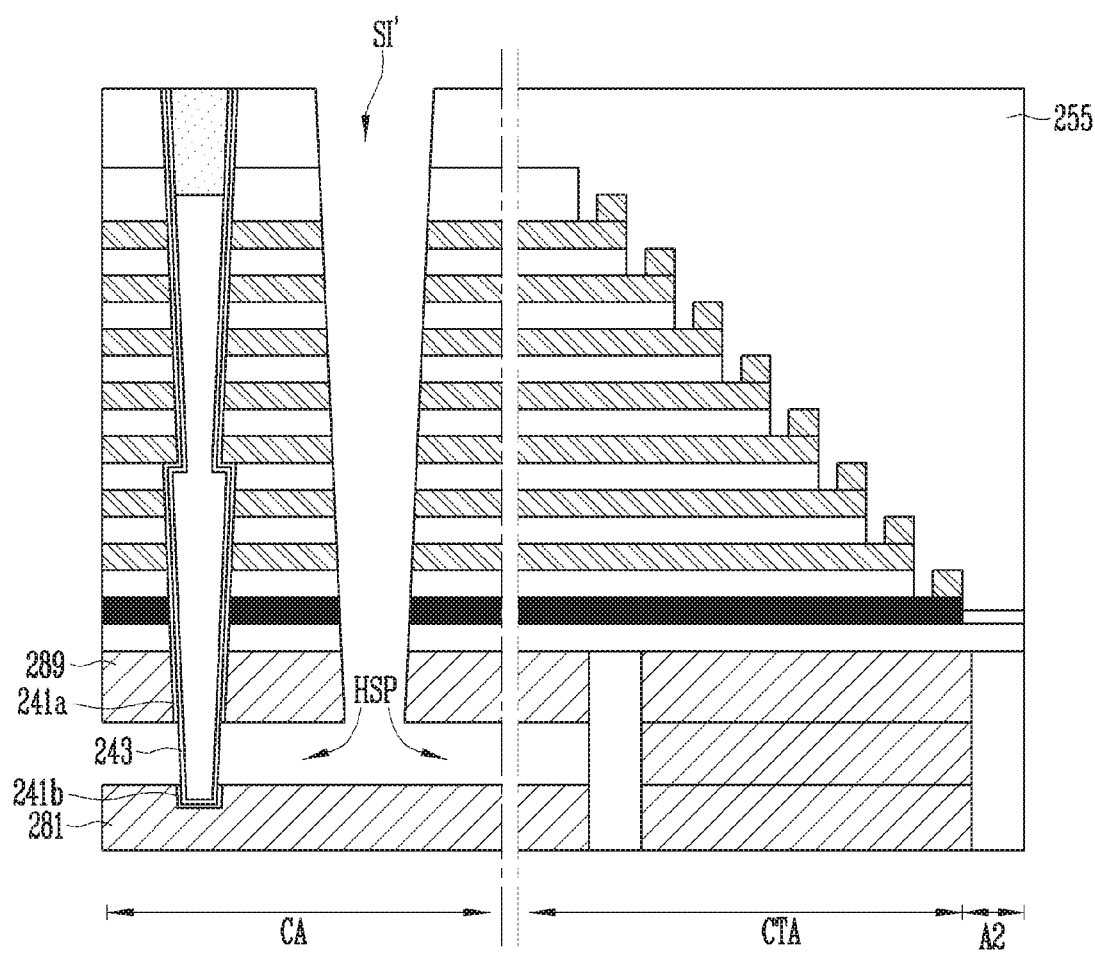

Referring to FIG. 8C, the second protective layer exposed by the slit SI' may be etched to expose the source sacrificial layer, and, subsequently, the source sacrificial layer may be removed. The multilayer enclosing a portion of a sidewall of the channel layer 243 may be exposed through a region from which the source sacrificial layer is removed. A horizontal opening HSP may be formed by removing the exposed multilayer. The multilayer may be divided into an upper pattern 241a and a lower pattern 241b and the sidewall of the channel layer 243 may be exposed by the horizontal opening HSP. When the horizontal opening HSP is formed, the first and second protective layers may be removed to expose the first doped semiconductor layer 281 and the second doped semiconductor layer 289.

Figure 8D:
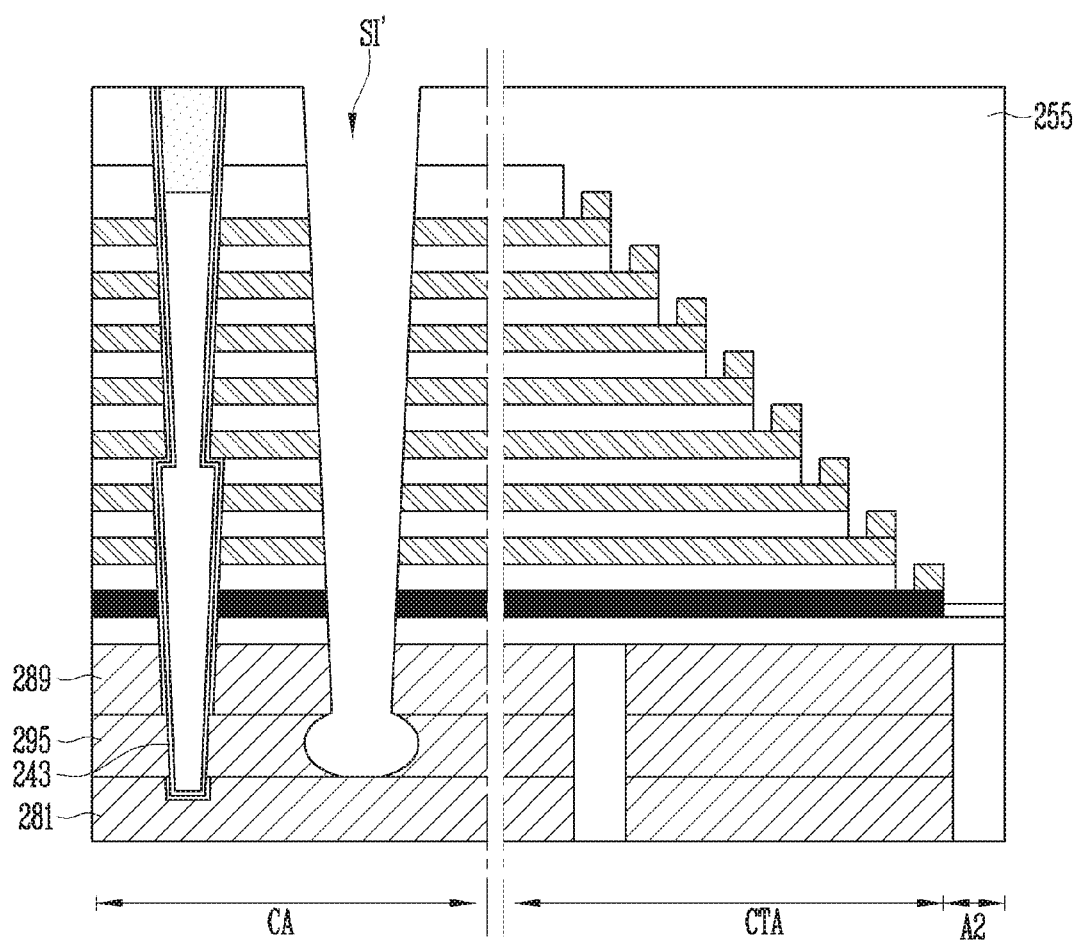

Referring to FIG. 8D, a third doped semiconductor layer 295 may be formed in the horizontal opening HSP illustrated in FIG. 8C. The third doped semiconductor layer 295 may contact the channel layer 243, the first doped semiconductor layer 281, and the second doped semiconductor layer 289. The third doped semiconductor layer 295 may be formed by a chemical vapor deposition method or a growth method using the channel layer 243, the first doped semiconductor layer 281, and the second doped semiconductor layer 289 as seed layers.

Figure 8E:
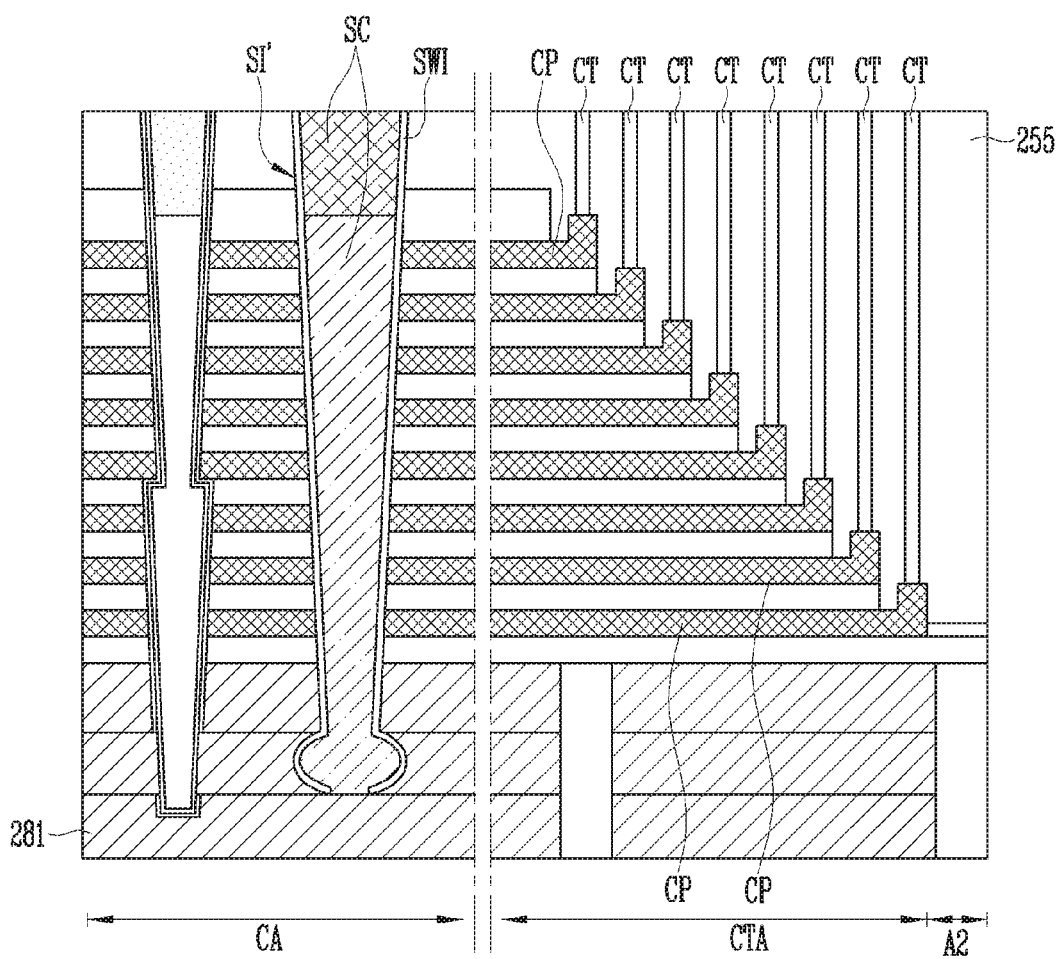

Referring to FIG. 8E, the first and second sacrificial layers, the first etch stop pattern, and the sacrificial pad patterns may be replaced with the conductive patterns CP by using the processes described with respect to FIGS. 7A to 7D.

Subsequently, the sidewall insulating layer SWI may be formed on a sidewall of the slit SI'. Thereafter, the source contact structure SC filling the slit SI' may be formed. The source contact structure SC may pass through the sidewall insulating layer SWI to contact the first doped semiconductor layer 281.

Thereafter, contact plugs CT contacting the conductive patterns CP by passing through the upper insulating layer 255 may be formed.

FIGS. 9A to 9E are cross-sectional views illustrating a manufacturing method of a semiconductor device according to an embodiment of the present disclosure. Hereinafter, a detailed description of any repetitive processes described above will be omitted.

Figure 9A:
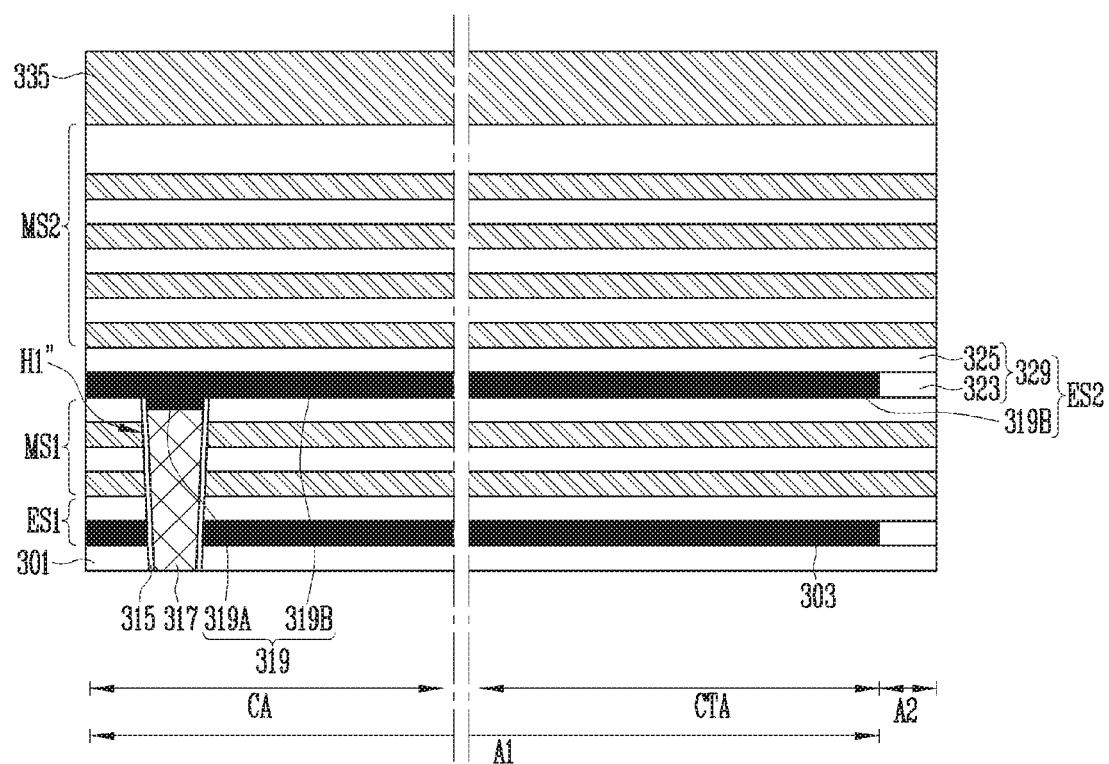
FIGS. 9A to 9E are cross-sectional views illustrating a manufacturing method of a semiconductor device according to an embodiment of the present disclosure.

Referring to FIG. 9A, a lower etch stop structure ES1 may be formed on a lower structure 301 including the first region A1 and the second region A2.

The lower structure 301 may include the substrate SUB and the peripheral circuit structure PC which are illustrated in FIG. 1. The lower structure 301 may further include various structures depending on a structure of a memory string to be formed. For example, the lower structure 301 may include the first doped semiconductor layer 281, the first protective layer 283, the source sacrificial layer 285, the second protective layer 287, the second doped semiconductor layer 289, and the interlayer insulating layer 291 which are described with reference to FIG. 8A. Alternatively, the lower structure 301 may further include the doped region SA described with reference to FIG. 3B, the lower stack structure LST described with reference to FIG. 3C, or the pipe gate PG described with reference to FIG. 3D.

The lower etch stop structure ES1 may be formed using the processes described with reference to FIGS. 4A to 4C.

Subsequently, the first stack structure MS1 may be formed on the lower etch stop structure ES1 by using the process described with reference to FIG. 5A. Thereafter, a first hole H1" passing through the first stack structure MS1 may be formed, and a protective oxide layer 315 may be formed on a surface of the first hole H1". Subsequently, a metal layer 317 filling a portion of the first hole H1" may be formed on the protective oxide layer 315. The metal layer 317 may include metal having strength to withstand process stress, for example, tungsten (W).

Thereafter, a second etch stop pattern 319 filling the first hole H1" on the metal layer 317 and extending to cover the first stack structure MS1 may be formed. The second etch stop pattern 319 may be patterned not to overlap the second region A2. The second etch stop pattern 319 may include a first portion 319A filling the first hole H1" and a second portion 319B extending to cover the first stack structure MS1 on the first portion 319A. Processes for forming the second etch stop pattern 319 may include forming the first portion 319A filling the first hole H", forming an etch stop layer to cover the first portion 319A and the first stack structure MS1, and forming the second portion 319B by patterning the etch stop layer.

The first portion 319A and the second portion 319B of the second etch stop pattern 319 may include the same material layer. The first portion 319A and the second portion 319B of the second etch stop pattern 319 may include the same material as a first etch stop pattern 303 of the lower etch stop structure ES1. The first and second etch stop patterns 303 and 319 may be selected considering etch rates of material layers which constitute the first stack structure MS1 and the second stack structure MS2.

The first and second etch stop patterns 303 and 319 may include material layers having a significantly different etch rate from an oxide layer and a nitride layer than a polysilicon layer so as to decrease a slope of an etched surface of the channel hole or the slit as described with reference to FIG. 4A. In other words, the first and second etch stop patterns 303 and 319 may include metal. For example, the first and second etch stop patterns 303 and 319 may include a titanium (Ti) compound, such as a titanium nitride (TiN) layer.

The first and second etch stop patterns 303 and 319 may be patterned to cover the first region A1 of the lower structure 301 and expose the second region A2 of the lower structure 301 so that a phenomenon in which a contact plug disposed at the second region A2 is electrically coupled to the first and second etch stop patterns 303 and 319 to cause a defect in a semiconductor element may be prevented as described with reference to FIG. 4A.

The second etch stop pattern 319 may be covered by an interlayer insulating layer 329. The interlayer insulating layer 329 may include a first insulating layer 323 and a second insulating layer 325. The first insulating layer 323 may be formed using a process which is the same as the process for forming the insulating pattern 105P as described with reference to FIGS. 4A and 4B. The second insulating layer 325 may be formed using a process which is the same as the process for forming the insulating layer 107 as described with reference to FIG. 4C. Hereinafter, a stack structure of the second portion 319B of the second etch stop pattern 319 and the interlayer insulating layer 329 may be defined as an interlayer etch stop structure ES2.

After forming the interlayer etch stop structure ES2, the second stack structure MS2 may be formed on the interlayer etch stop structure ES2 by using the process described with reference to FIG. 5C. The second stack structure MS2 may extend to overlap the first and second etch stop patterns 303 and 319 and the second region A2.

Subsequently, a mask layer 335 may be formed on the second stack structure MS2. The mask layer 335 may include a nitride layer such as a silicon nitride layer.

Figure 9B:
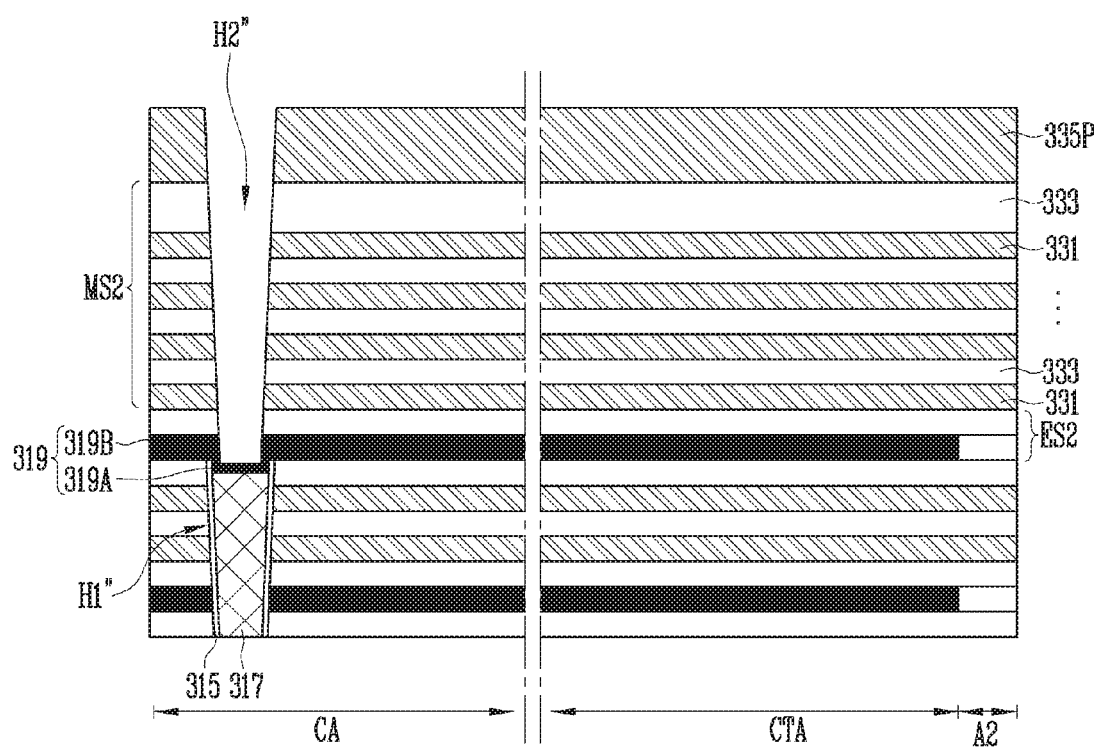

Referring to FIG. 9B, the mask layer 335 illustrated in FIG. 9A may be patterned using a photolithography process.

Thereby, a mask pattern 335P may be formed. Thereafter, a second hole H2" exposing the first portion 319A of the second etch stop pattern 319 may be formed by etching the second stack structure MS2 and the interlayer etch stop structure ES2 which are exposed through the mask pattern 335P.

During an etching process for forming the second hole H2", the second etch stop pattern 319 may serve as an etch stop layer. A width of a lower end of the second hole H2" may be increased using a difference in etch rate between the second etch stop pattern 319, and second interlayer insulating layers 333 and second sacrificial layers 331 of the second stack structure MS2. Thereby, a difference in width between an upper end of the second hole H2" and the lower end of the second hole H2" may be decreased. The second hole H2" may be aligned on the first hole H1".

Figure 9C:
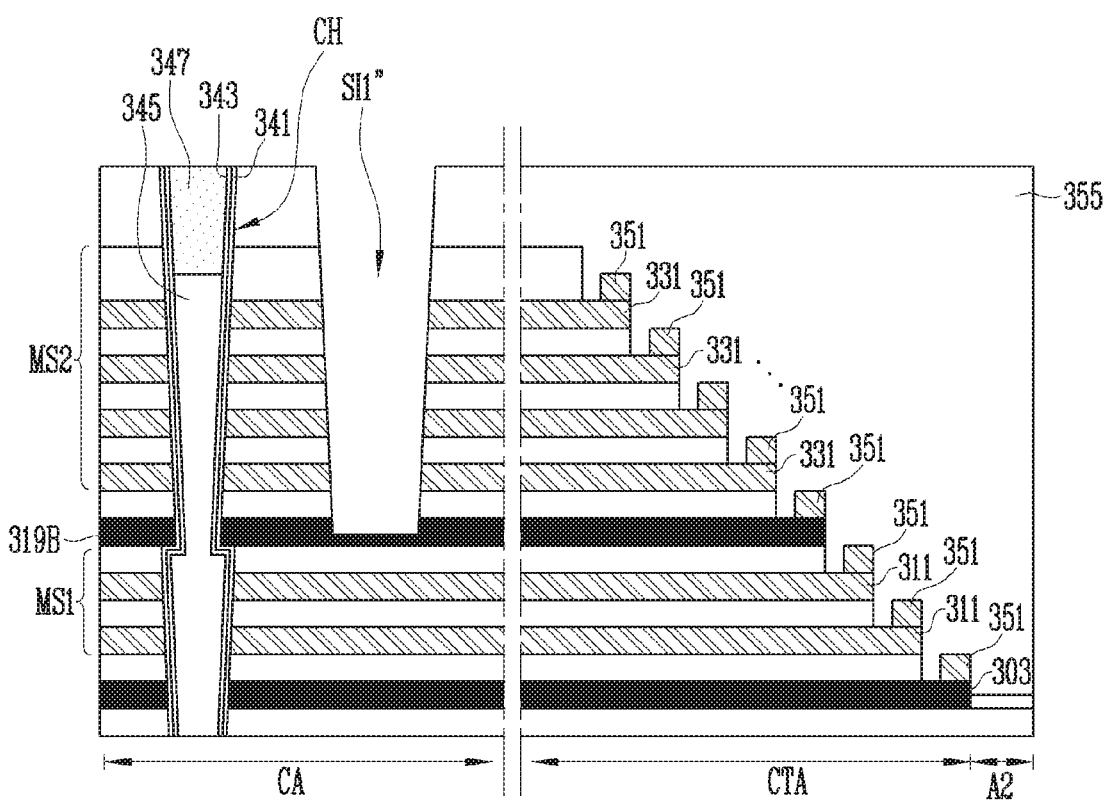

Referring to FIG. 9C, the first hole H1" may be opened by removing the first portion 319A of the second etch stop pattern 319, the metal layer 317, and the protective oxide layer 315 through the second hole H2" illustrated in FIG. 9B. Thereby, the channel hole CH in which the first hole H1" and the second hole H2" are coupled may be defined.

Thereafter, a multilayer 341, a channel layer 343, a core insulating layer 345, and a doped semiconductor pattern 347 may be formed in the channel hole CH by using the process described with reference to FIG. 5F.

Subsequently, a stepped stack structure having a stepped end portion may be formed on the contact region CTA, and sacrificial pad patterns 351 may be formed using the processes described with reference to FIGS. 6A and 6B. In an embodiment, the processes to form the stepped stack structure may also include etching the interlayer insulating layer (329 of FIG. 9A) covering the second portion 319B of the second etch stop pattern 319; the etching of the interlayer insulating layer (329 of FIG. 9A) may expose an end portion of the second portion 319B of the second etch stop pattern 319. The stepped end portion may be defined by end portions of the second sacrificial layers 331 of the second stack structure MS2, end portions of first sacrificial layers 311 of the first stack structure MS1, and an end portion of the second portion 319B of the second etch stop pattern 319. The sacrificial pad patterns 351 may be formed on an end portion of the first etch stop pattern 303 and the end portions of the first sacrificial layers 311, the second portion 319B of the second etch stop pattern 319, and the second sacrificial layers 331 which define the stepped end portion, respectively. Thereafter, an upper insulating layer 355 may be formed.

Thereafter, a first slit SI1" passing through the upper insulating layer 355 and the second stack structure MS2 and exposing the second portion 319B of the second etch stop pattern 319 may be formed. During the first etching process for forming the first slit SI1", the second portion 319B of the second etch stop pattern 319 may serve as an etch stop layer. In an embodiment, the first slit SI1" may further pass through the second insulating layer (325 of FIG. 9A) of the interlayer insulating layer (329 of FIG. 9A).

Figure 9D:
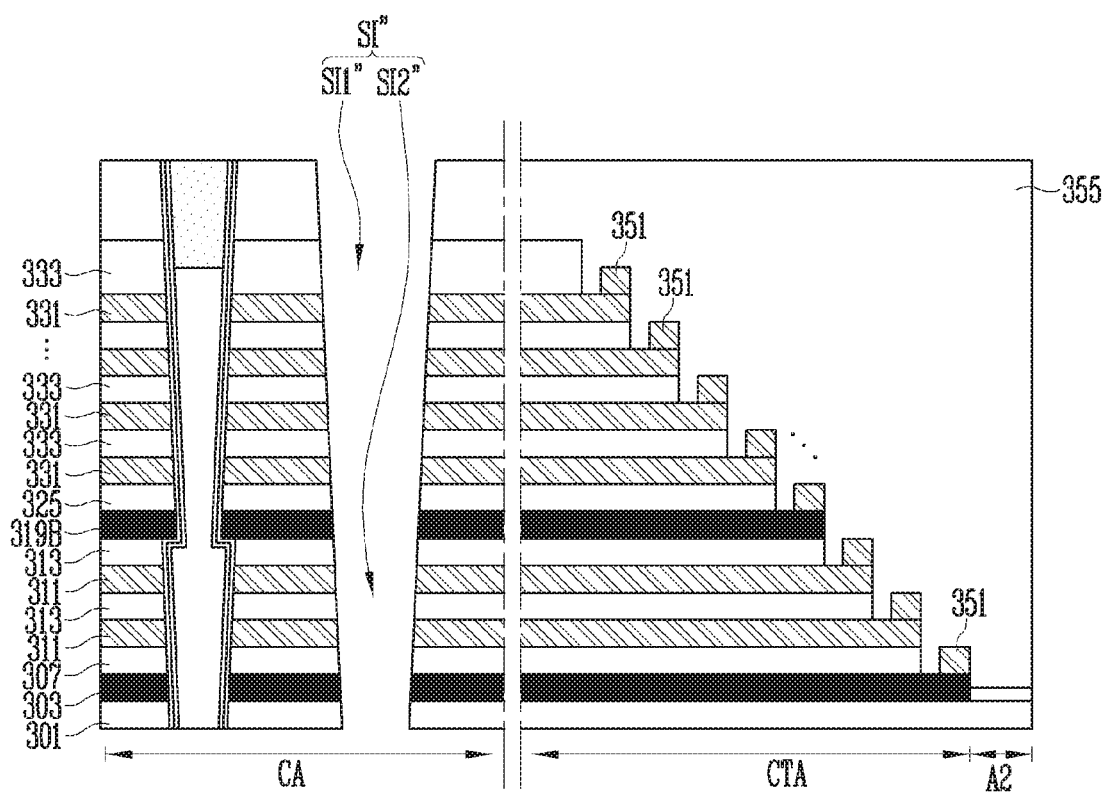

Etching the second portion 319B of the second etch stop pattern 319 which is exposed by the first slit SI1" illustrated in FIG. 9C, etching the first stack structure MS1, and etching the first etch stop pattern 303 may be sequentially performed. Thereby, a second slit SI2" coupled to the first slit SI1" and extending to pass through the lower structure 301 may be formed as illustrated in FIG. 9D. Hereinafter, a connection structure of the first slit SI1" and the second slit SI2" may be defined as a slit SI".

Referring to FIG. 9D, the lower structure 301, the first etch stop pattern 303, interlayer insulating layers 307, 313, and 333, the second portion 319B of the second etch stop pattern 319, and the first and second sacrificial layers 311 and 331 may be exposed by a sidewall of the slit SI". In an embodiment, the second insulating layer 325 of the interlayer insulating layer (329 of FIG. 9A) may be also exposed by the sidewall of the slit SI".

Subsequently, the first etch stop pattern 303 and the second portion 319B of the second etch stop pattern 319 may be selectively removed through the slit SI". Thereafter, the first and second sacrificial layers 311 and 331 and the sacrificial pad patterns 351 may be removed through the slit SI".

Figure 9E:
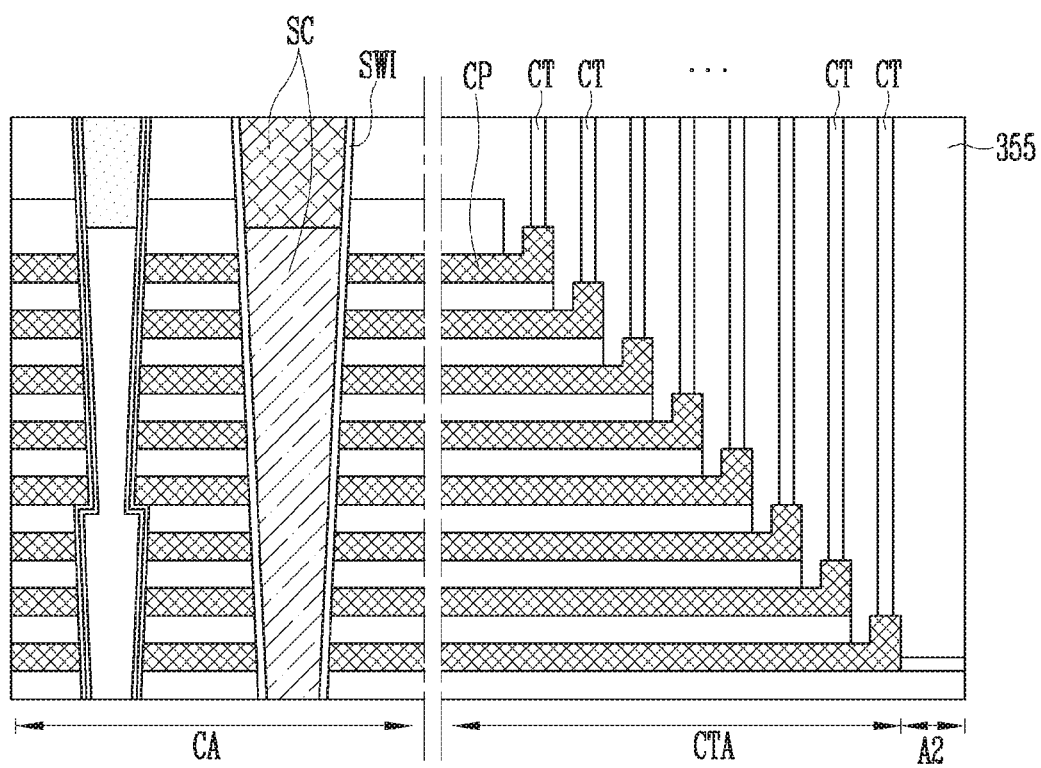

Referring to FIG. 9E, regions from which the first etch stop pattern 303, the second portion 319B of the second etch stop pattern 319, the first and second sacrificial layers 311 and 331, and the sacrificial pad patterns 351 are removed may be filled with the conductive patterns CP. Thereafter, the sidewall insulating layer SWI, the source contact structure SC, and the contact plugs CT may be formed using the processes described with reference to FIG. 8E.

The manufacturing method of a semiconductor device according to an embodiment of the present disclosure may be used for forming the memory string shown in FIGS. 3A to 3D.

According to embodiments of the present disclosure, a level of difficulty of the etching process for forming the hole and the slit by using the etch stop pattern may be decreased.

According to embodiments of the present disclosure, a level of difficulty of the process for forming the pad portion of the conductive pattern so that the pad portion may have a great thickness (e.g., a greater thickness than the line portion) by using the etch stop pattern may be decreased.

Since the etch stop pattern according to embodiments of the present disclosure includes a material having a significantly different etch rate from the stack structure penetrated by the hole and the slit, widths of the hole and the slit may be uniform.

Since the etch stop pattern according to embodiments of the present disclosure is patterned before forming the stepped stack structure, a defect rate of a semiconductor device may be decreased.

Figure 10:
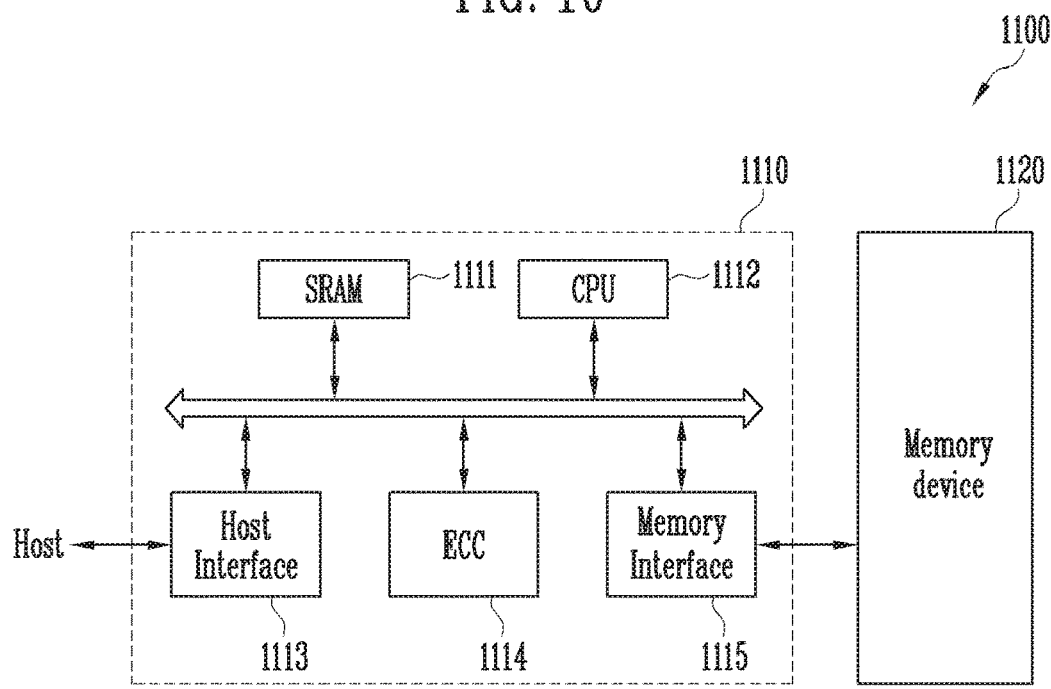
FIG. 10 is a block diagram illustrating a configuration of a memory system according to an embodiment of the present disclosure.

FIG. 10 is a block diagram illustrating a configuration of a memory system 1100 according to an embodiment of the present disclosure.

Referring to FIG. 10, the memory system 1100 according to an embodiment of the present disclosure may include a memory device 1120 and a memory controller 1110.

The memory device 1120 may be a multi-chip package formed of a plurality of flash memory chips.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112. The CPU 1112 may perform overall control operations for data exchange of the memory controller 1110. The host interface 1113 may include a data exchange protocol for a host connected with the memory system 1100. The ECC 1114 may detect and correct errors included in the data read from the memory device 1120. The memory interface 1115 may perform interfacing with the memory device 1120. In addition, the memory controller 1110 may further include a Read Only Memory (ROM) for storing code data for interfacing with the host.

In an embodiment, the above-described memory system 1100 may be a memory card or a Solid State Disk (SSD) equipped with the memory device 1120 and the memory controller 1110. For example, when the memory system 1100 is an SSD, the memory controller 1110 may communicate with an external device (e.g., a host) through one of various interface protocols including a Universal Serial Bus (USB) protocol, a MultiMedia Card (MMC) protocol, a Peripheral Component Interconnection-Express (PCI-E) protocol, a Serial Advanced Technology Attachment (SATA) protocol, a Parallel Advanced Technology Attachment (PATA) protocol, a Small Computer Small Interface (SCSI) protocol, an Enhanced Small Disk Interface (ESDI) protocol, an Integrated Drive Electronics (IDE) protocol, etc.

Figure 11:
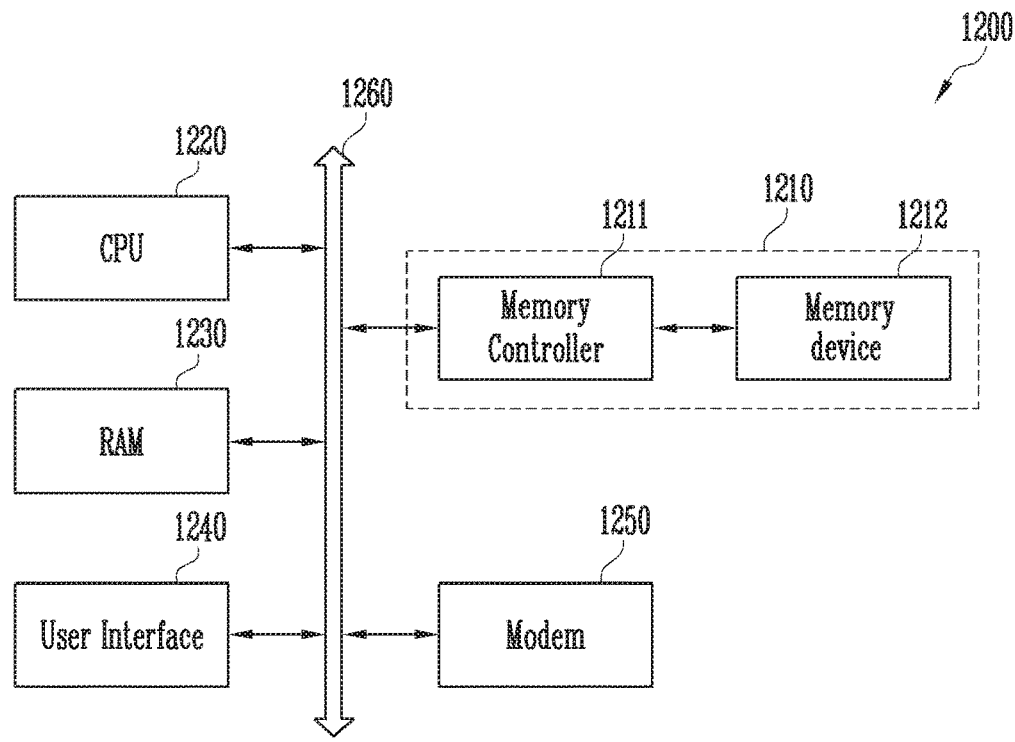
FIG. 11 is a block diagram illustrating the configuration of a computing system according to an embodiment of the present disclosure.

FIG. 11 is a block diagram illustrating the configuration of a computing system 1200 according to an embodiment of the present disclosure.

Referring to FIG. 11, the computing system 1200 according to an embodiment of the present disclosure may include a CPU 1220, a Random Access Memory (RAM) 1230, a user interface 1240, a modem 1250, and a memory system 1210 which are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

The memory system 1210 may be configured with a memory device 1212 and a memory controller 1211.

The above-described embodiments are provided for the purpose of conveying an understanding of the technical spirit of the present disclosure. The scope of the present disclosure should not be limited to the above-described embodiments. It will be obvious to those skilled in the art to which the present disclosure pertains that other modifications based on the technical spirit of the present disclosure may be made in addition to the above-described embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:

1. A method of manufacturing a semiconductor device, the method comprising:
   forming a lower structure including a first region and a second region;
   forming a first etch stop pattern on the lower structure, wherein the first etch stop pattern exposes the second region;
   stacking a plurality of stack structures including sacrificial layers on the lower structure to overlap the second region and the first etch stop pattern;
   forming a stepped stack structure by etching the plurality of stack structures, wherein the stepped stack structure exposes an end portion of the first etch stop pattern;
   forming a slit passing through the stepped stack structure and the first etch stop pattern; and
   removing the sacrificial layers of the plurality of stack structures and the first etch stop pattern with conductive patterns through the slit to form opening; and
   forming conductive patterns in the opening, respectively, wherein the lower structure includes a peripheral circuit and the stepped stack structure is located over the peripheral circuit.

2. The method of claim 1, wherein forming the stepped stack structure by etching the plurality of the stack structures includes exposing the second region.

3. The method of claim 1, wherein each of the plurality of stack structures includes the sacrificial layers and interlayer insulating layers alternately stacked, and
wherein the first etch stop pattern includes a material having a different etch rate from the sacrificial layers and the interlayer insulating layers.

4. The method of claim 3, wherein the sacrificial layers include nitride layers,
wherein the interlayer insulating layers include oxide layers, and
wherein the first etch stop pattern includes metal.

5. The method of claim 3, wherein the sacrificial layers include nitride layers,
wherein the interlayer insulating layers include oxide layers, and
wherein the first etch stop pattern includes a titanium (Ti) compound.

6. The method of claim 3, wherein the sacrificial layers include nitride layers,
wherein the interlayer insulating layers include oxide layers, and
wherein the first etch stop pattern includes a titanium nitride (TiN) layer.

7. The method of claim 1, wherein the stacking of the plurality of stack structures comprises:
forming a first stack structure extending to overlap the first etch stop pattern and the second region;
forming a first hole passing through the first stack structure;
forming a sacrificial pillar filling the first hole;
forming a second stack structure on the first stack structure to cover the sacrificial pillar;
forming a second hole passing through the second stack structure and exposing the sacrificial pillar;
removing the sacrificial pillar through the second hole to open the first hole; and
forming a channel layer in a channel hole defined by coupling the first hole and the second hole.

8. The method of claim 7, wherein the forming of the sacrificial pillar comprises:
forming a protective oxide layer on a surface of the first hole;
forming a metal layer filling a portion of the first hole on the protective oxide layer; and
forming a second etch stop pattern filling an upper portion of the first hole on the metal layer.

9. The method of claim 1, wherein the stepped stack structure includes a stepped end portion formed of end portions of the sacrificial layers and exposes the end portion of the first etch stop pattern,
wherein the method further comprises forming sacrificial pad patterns on the end portion of the first etch stop pattern exposed by the stepped end portion and on the end portions of the sacrificial layers, and
wherein the sacrificial pad patterns are replaced with the conductive patterns.

10. The method of claim 9, wherein the removing of the sacrificial layers and the first etch stop pattern comprises:
selectively removing the first etch stop pattern through the slit; and
selectively removing the sacrificial layers and the sacrificial pad patterns through the slit.

11. The method of claim 1, wherein the stepped stack structure includes a memory block, the first region is overlapped with the memory block and the second region is not overlapped with the memory block.

12. A method of manufacturing a semiconductor device, the method comprising:
forming a lower structure;
forming an etch stop pattern including metal over the lower structure;
forming a stack structure including sacrificial layers over the etch stop pattern;
forming a slit passing through the stack structure and the etch stop pattern;
removing the sacrificial layers and the etch stop pattern through the slit to form openings; and
forming conductive patterns in the openings, respectively.

13. The method of claim 12, wherein the stack structure includes an oxide layer and a nitride layer, and
wherein the etch stop pattern includes a material having a different etch rate from the oxide layer and the nitride layer.

14. A method of manufacturing a semiconductor device, the method comprising:
forming a lower structure;
forming a first etch stop pattern on the lower structure;
forming a first stack structure including sacrificial layers on the first etch stop pattern;
forming a first hole passing through the first stack structure;
forming a sacrificial pillar including a second etch stop pattern in the first hole;
forming a second stack structure on the first stack structure and the second etch stop pattern;
forming a slit passing through the second stack structure, the first stack structure and the first etch stop pattern;
removing the sacrificial layers, the first etch stop pattern and the second etch stop pattern through the slit to form openings; and
forming conductive patterns in the openings, respectively.

15. The method of claim 14, wherein the forming of the sacrificial pillar comprises:
forming a protective layer in the first hole;
forming a metal layer in the protective layer; and
forming the second etch stop pattern in the protective layer.

16. The method of claim 15, wherein the protective layer includes an oxide layer.

17. The method of claim 15, further comprising:
forming a second hole passing through the second stack structure;
removing the sacrificial pillar through the second hole; and
forming a channel layer in the first hole and the second hole.

18. The method of claim 15, wherein the lower structure includes a peripheral circuit, and
wherein the first stack structure is located over the peripheral circuit.

19. The method of claim 15, wherein the first etch stop pattern or the second etch stop pattern includes metal.

* * * * *